United States Patent
Cao et al.

(10) Patent No.: US 12,199,227 B2
(45) Date of Patent: Jan. 14, 2025

(54) DRIVING SUBSTRATE, METHOD FOR PREPARING THE SAME, AND DISPLAY DEVICE

(71) Applicant: BOE TECHNOLOGY GROUP CO., LTD., Beijing (CN)

(72) Inventors: Zhanfeng Cao, Beijing (CN); Ke Wang, Beijing (CN); Jianguo Wang, Beijing (CN); Guocai Zhang, Beijing (CN); Guangcai Yuan, Beijing (CN); Xue Dong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 786 days.

(21) Appl. No.: 17/260,778

(22) PCT Filed: Apr. 10, 2020

(86) PCT No.: PCT/CN2020/084206
§ 371 (c)(1),
(2) Date: Jan. 15, 2021

(87) PCT Pub. No.: WO2021/203415
PCT Pub. Date: Oct. 14, 2021

(65) Prior Publication Data
US 2021/0359182 A1 Nov. 18, 2021

(51) Int. Cl.
*H01L 33/62* (2010.01)
*H01L 33/12* (2010.01)

(52) U.S. Cl.
CPC .............. *H01L 33/62* (2013.01); *H01L 33/12* (2013.01); *H01L 2933/0066* (2013.01)

(58) Field of Classification Search
CPC .............. H01L 23/562; H01L 25/0655; H01L 25/0753; H01L 25/167; H01L 27/124;
(Continued)

(56) References Cited

U.S. PATENT DOCUMENTS

2015/0235955 A1  8/2015  Kudo et al.
2015/0282323 A1  10/2015 Shimizu et al.
(Continued)

FOREIGN PATENT DOCUMENTS

CN    109541865 A    3/2019
CN    109597245 A    4/2019
(Continued)

OTHER PUBLICATIONS

Office Action dated Nov. 16, 2023 issued in counterpart Japan Application No. 2021-572429 (with English translation), 10 pages.
(Continued)

*Primary Examiner* — Robert K Carpenter
(74) *Attorney, Agent, or Firm* — Muncy, Geissler, Olds & Lowe, P.C.

(57) ABSTRACT

The present disclosure provides a driving substrate, a method for preparing the same, and a display device. The driving substrate includes: a base substrate; a stress buffer layer located on the base substrate; a plurality of first wirings located on a surface of the stress buffer layer away from the base substrate; a first insulating layer located on a surface of the first wiring away from the base substrate; a plurality of second wiring structures located on a surface of the first insulating layer away from the base substrate; a second insulating layer located on a surface of the second wiring structure away from the base substrate; an electronic element located on a surface of the second insulating layer away from the base substrate.

20 Claims, 16 Drawing Sheets

(58) Field of Classification Search
CPC . H01L 27/1248; H01L 27/1262; H01L 33/12; H01L 33/62
See application file for complete search history.

(56) References Cited

U.S. PATENT DOCUMENTS

| | | | |
|---|---|---|---|
| 2016/0289840 | A1 | 10/2016 | Sato et al. |
| 2016/0336261 | A1 | 11/2016 | Furutani et al. |
| 2018/0254226 | A1 | 9/2018 | Iguchi |
| 2019/0181172 | A1* | 6/2019 | Kim .................... H01L 25/0657 |
| 2019/0392751 | A1 | 12/2019 | Hsieh |
| 2020/0035147 | A1 | 1/2020 | Ban et al. |
| 2021/0076491 | A1 | 3/2021 | Kijima |
| 2021/0091057 | A1 | 3/2021 | Liang et al. |
| 2021/0091152 | A1 | 3/2021 | Yang et al. |
| 2021/0110761 | A1 | 4/2021 | Liu et al. |
| 2021/0223631 | A1 | 7/2021 | Ban et al. |
| 2021/0305121 | A1* | 9/2021 | Mallik ................ H01L 23/5383 |
| 2022/0005989 | A1 | 1/2022 | Ban et al. |
| 2022/0037297 | A1* | 2/2022 | Lu ...................... H01L 27/1259 |
| 2022/0181522 | A1* | 6/2022 | Moon .................. H01L 27/124 |

FOREIGN PATENT DOCUMENTS

| | | |
|---|---|---|
| CN | 110544704 A | 12/2019 |
| CN | 110610975 A | 12/2019 |
| CN | 110634905 A | 12/2019 |
| CN | 110649059 A | 1/2020 |
| CN | 110690244 A | 1/2020 |
| CN | 110972495 A | 4/2020 |
| CN | 111051975 A | 4/2020 |
| JP | 2015-185773 A | 10/2015 |
| JP | 2016-092365 A | 5/2016 |
| JP | 2016-196673 A | 11/2016 |
| JP | 2019-204921 A | 11/2019 |
| WO | WO-2014/069662 A1 | 5/2014 |
| WO | WO-2017/043216 A1 | 3/2017 |
| WO | WO-2020066447 A1 | 4/2020 |

OTHER PUBLICATIONS

Extended European Search Report in corresponding PCT Application No. PCT/CN2020084206 mailed Jun. 4, 2023 is attached, 9 pages.

* cited by examiner

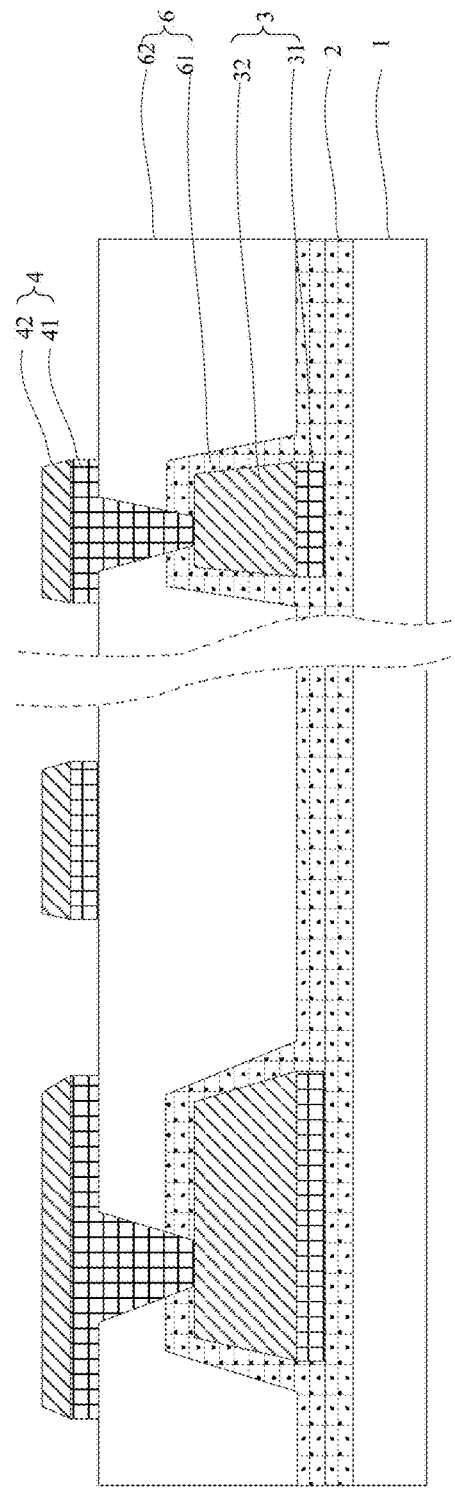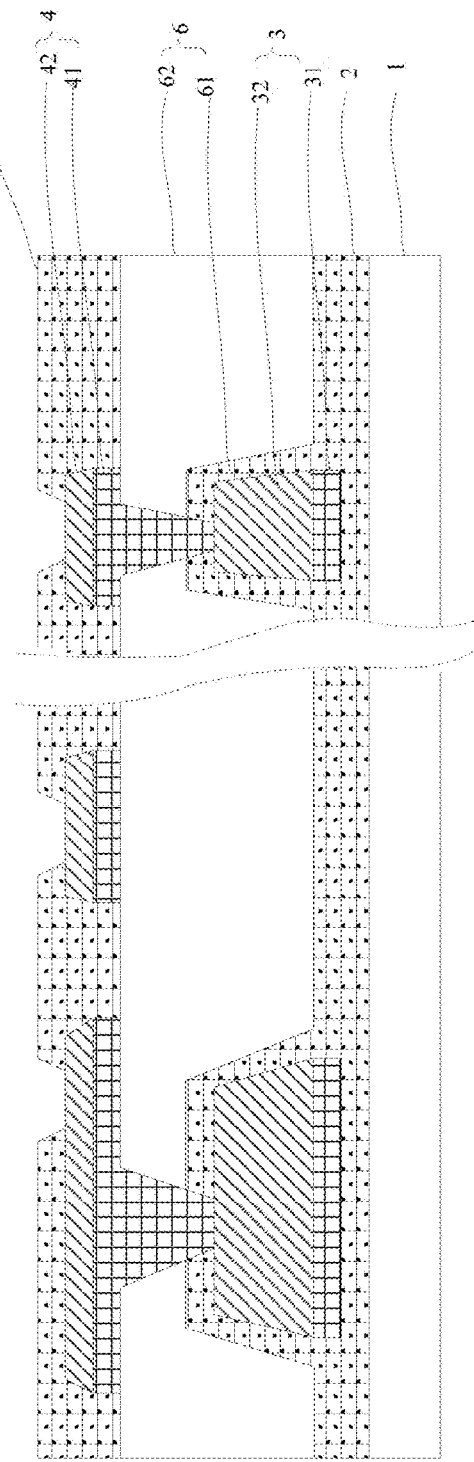

DRIVING SUBSTRATE, METHOD FOR PREPARING THE SAME, AND DISPLAY DEVICE

CROSS-REFERENCE TO RELATED APPLICATION

This application is the U.S. national phase of PCT Application No. PCT/CN2020/084206 filed on Apr. 10, 2020, the disclosure of which is incorporated in its entirety by reference herein.

TECHNICAL FIELD

The present disclosure relates to the field of display technology, in particular to a driving substrate, a method for preparing the same, and a display device.

BACKGROUND

High-dynamic range (HDR) technology achieves high-contrast and high-color gamut display effect. In a display device with HDR technology, a display device with HDR technology requires a large number of signal wirings to transmit electrical signals. Therefore, how to preparing a signal wiring that can carry a large load to reduce line resistance loss is one of the technical issues that need to be considered in the semiconductor field.

SUMMARY

The embodiments of the present disclosure provide a driving substrate, a method for preparing the same, and a display device, that are capable of reducing the number of the patterning process for preparing the driving substrate.

Embodiments of the present disclosure provide technical solutions as follows.

In one aspect, a driving substrate is provided, including: a base substrate; a stress buffer layer located on the base substrate; a plurality of first wirings located on a surface of the stress buffer layer away from the base substrate, the plurality of first wirings having a first thickness; a first insulating layer located on a surface of the first wiring away from the base substrate; a plurality of second wiring structures located on a surface of the first insulating layer away from the base substrate, each of the plurality of first wirings being connected to at least one of the plurality of second wiring structures through a first via hole penetrating through the first insulating layer, the plurality of second wiring structures having a second thickness, and the second thickness being less than the first thickness; a second insulating layer located on a surface of the plurality of second wiring structures away from the base substrate; and an electronic element located on a surface of the second insulating layer away from the base substrate, the electronic element being connected to the plurality of second wiring structures through a second via hole penetrating through the second insulating layer.

In some embodiments, the first wiring includes a copper layer and a first metal layer that are stacked, the first metal layer is located on a surface of the copper layer proximate to the base substrate, and an adhesion force between the first metal layer and the stress buffer layer is greater than an adhesion force between the copper layer and the stress buffer layer.

In some embodiments, the copper layer has a thickness in a range from 1 to 30 μm.

In some embodiments, the first wiring further includes a first conductive protection layer located on a surface of the copper layer proximate to the base substrate.

In some embodiments, the second wiring structure includes at least one second wiring layer, and each of the at least one second wiring layer includes a plurality of second wirings, in the situation that the at least one second wiring layer includes several second wiring layers, an insulating layer is arranged between two adjacent second wiring layers, and in a direction away from the base substrate, each of the second wirings in a previous second wiring layer is connected to at least one of the second wirings in a next second wiring layer, and each of the second wirings in the last second wiring layer is connected to at least one of the electronic elements.

In some embodiments, the second wiring includes a copper layer and a second metal layer that are stacked, the second metal layer is located on a surface of the copper layer proximate to the base substrate, and an adhesion force between the second metal layer and the first insulating layer is greater than an adhesion force between the copper layer and the first insulating layer.

In some embodiments, the driving substrate includes a display area and a fan-out area located at a periphery of the display area, and the driving substrate further includes: a second conductive protection layer covering the second wiring of the fan-out area.

In some embodiments, the first insulating layer includes: a first inorganic insulating layer and a first organic insulating layer that are stacked, the first organic insulating layer being located on a surface of the first inorganic insulating layer away from the base substrate.

In some embodiments, the driving substrate further includes: a fourth inorganic insulating layer located on the surface of the first organic insulating layer away from the base substrate, the second wiring structure being located on a surface of the fourth inorganic insulating layer away from the base substrate.

An embodiment of the present disclosure further provides a display device including the driving substrate as described above.

An embodiment of the present disclosure further provides a method for preparing a driving substrate, including: providing a base substrate; forming a stress buffer layer on the base substrate; forming a plurality of first wirings on the stress buffer layer through a single patterning process, the plurality of first wirings having a first thickness; forming a first insulating layer covering the first wiring, the first insulating layer including a first via hole exposing a part of a surface of the first wiring; forming a plurality of second wiring structures on the first insulating layer, each of the plurality of first wirings being connected to at least one of the plurality of second wiring structures through a first via hole penetrating through the first insulating layer, the plurality of second wiring structures having a second thickness, and the second thickness being less than the first thickness; forming a second insulating layer covering the plurality of second wiring structures, the second insulating layer including a second via hole exposing a part of a surface of the second wiring structure; forming an electronic element on the second insulating layer, the electronic element being connected to the plurality of second wiring structures through a second via hole penetrating through the second insulating layer.

In some embodiments, the forming the plurality of first wirings includes: depositing a first conductive layer having a first thickness on the stress buffer layer and patterning the first conductive layer, to form the plurality of first wirings.

In some embodiments, the forming the plurality of first wirings includes: depositing a seed layer having a thickness less than the first thickness on the stress buffer layer, forming a negative photoresist on the seed layer, and exposing and developing the photoresist to form a photoresist removal area and a photoresist reserved area, the photoresist removal area corresponding to the plurality of first wirings to be formed; growing a third conductive layer by electroplating on the seed layer on which a pattern of the photoresist is formed; removing the photoresist in the photoresist reserved area; and etching the seed layer in the photoresist reserved area, the plurality of first wirings being composed of the third conductive layer and the seed layer in the photoresist removal area.

In some embodiments, the forming the plurality of first wirings includes: depositing a seed layer having a thickness less than the first thickness on the stress buffer layer, forming a photoresist on the seed layer, exposing and developing the photoresist to form a photoresist removal area and a photoresist reserved area, the photoresist reserved area corresponding to the first wiring to be formed, and etching the seed layer in the photoresist removal area, to form a pattern of the seed layer; and growing a third conductive pattern on the pattern of the seed layer by electroplating, the plurality of first wirings being composed of the third conductive pattern and the pattern of the seed layer.

In some embodiments, before growing the third conductive pattern on the pattern of the seed layer by electroplating, the method further includes: forming a third inorganic insulating layer; forming a third organic insulating layer on the third inorganic insulating layer; exposing and developing the third organic insulating layer, to form a pattern of the third organic insulating layer, the pattern of the third organic insulating layer including a third organic insulating layer reserved area and a third organic insulating layer removal area, and the third organic insulating layer removal area coinciding with the area where the pattern of the seed layer is located; and etching the third inorganic insulating layer by using the pattern of the third organic insulating layer as a mask, to form a pattern of the third inorganic insulating layer.

In some embodiments, the first insulating layer includes a first inorganic insulating layer and a first organic insulating layer that are stacked, and the forming the first insulating layer includes: forming a first inorganic insulating layer; forming a first organic insulating layer; exposing and developing the first organic insulating layer, to form a pattern of the first organic insulating layer including a third via hole, and etching the first inorganic insulating layer by using the pattern of the first organic insulating layer as a mask, to form a pattern of the first inorganic insulating layer including a fourth via hole, the third via hole communicating with the fourth via hole to form the first via hole.

In some embodiments, the second wiring structure includes at least one second wiring layer, each of the at least one second wiring layer includes a plurality of second wirings, and the forming the second wiring on the first insulating layer includes: sputtering a second conductive layer on the first insulating layer, and patterning the second conductive layer, to form the plurality of second wirings; or forming a second conductive layer on the first insulating layer by low-temperature deposition, and patterning the second conductive layer, to form the plurality of second wirings, a temperature of the low-temperature deposition being not greater than 50 degrees Celsius.

BRIEF DESCRIPTION OF THE DRAWINGS

FIGS. 3 to 22 are schematic view showing a process for preparing the driving substrate according to the embodiments of the disclosure.

Figure 1:
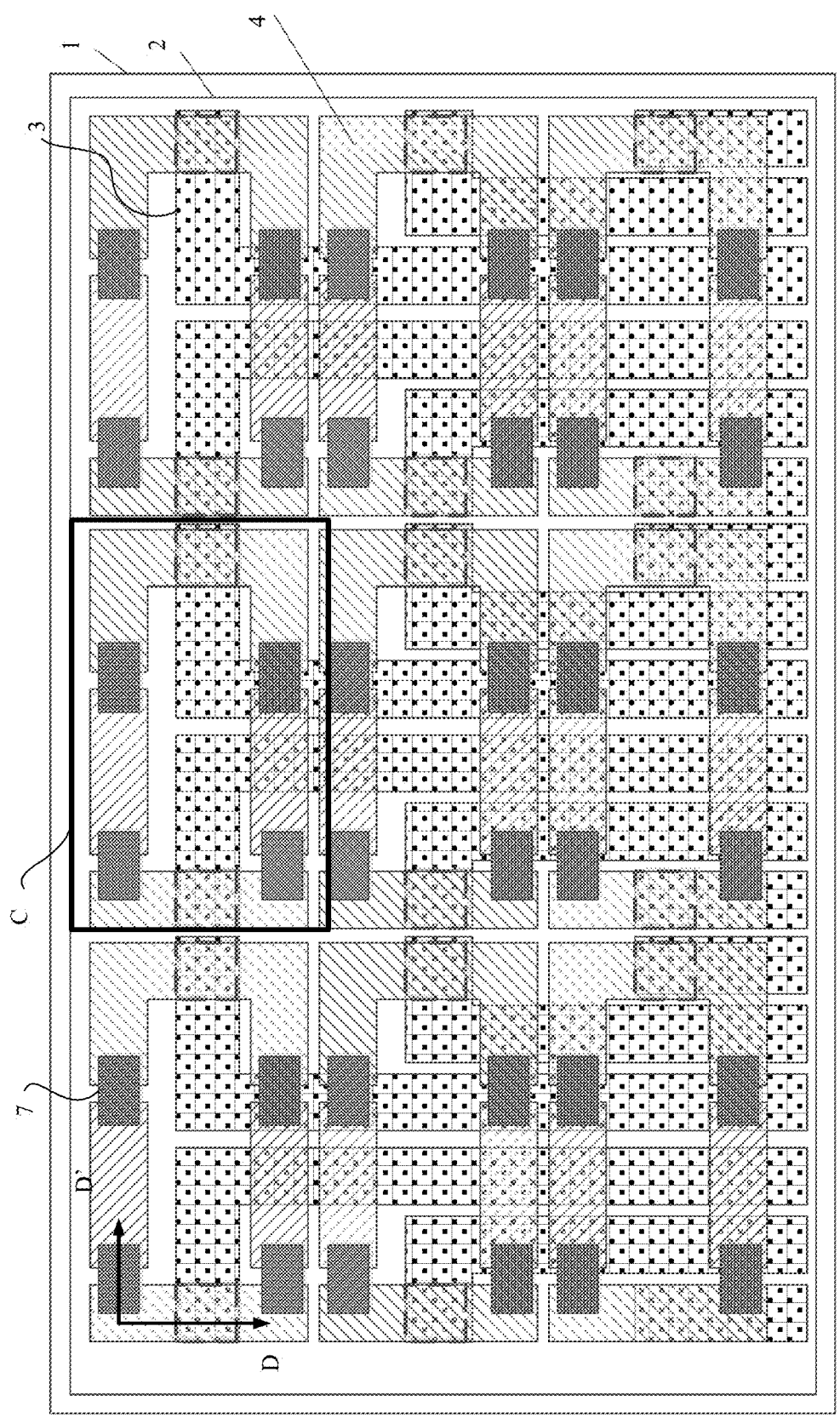
FIG. 1 is a schematic plan view showing a display area of a driving substrate according to an embodiment of the disclosure.

REFERENCE NUMBERS 1 base substrate; 2 stress buffer layer; 3 first wiring; 31 first metal layer; 32 copper layer; 4 second wiring; 41 second metal layer; 42 copper layer; 6 first insulating layer; 61 inorganic insulating layer; 62 first organic insulating layer; 8 fourth inorganic insulating layer; 12 second insulating layer; 13 second conductive protective layer; 14 reflective pattern; 15 first metal layer; 16 copper layer; 17, 19 pattern of photoresist; 18 third conductive layer; 20 third conductive pattern; 21 third inorganic insulating layer; 22 third organic insulating layer; 51 anode wiring; 52 cathode wiring; 53 connecting wiring; 7 LED; 71 N pad; 72 P pad; 73 epitaxial layer.

DETAILED DESCRIPTION

In order to make the technical problems to be solved, the technical solutions, and the advantages of the embodiments of the present disclosure, the present disclosure will be described hereinafter in conjunction with the drawings and specific examples.

High-dynamic range (HDR) technology can significantly enhances the contrast and viewing experience of liquid crystal displays. The perfect HDR requires high contrast and excellent color expression. The area light source controlled by zone can realize HDR technology, thereby greatly improving the display effect. When the area light source is composed of LED chips arranged in an array, since the LED needs to be driven by a large current, a thick copper process (copper having a thickness in a range from 1 to 20 μm) is required to prepare the wiring of the LED substrate, in order to minimize the loss of electrical signals in the signal line. In the related art, the LED is bound on a printed circuit board, and the printed circuit board is usually of small size due to cost limits. Therefore, if a large-size LED area light source is required, a small-size printed circuit board needs to be spliced together. However, it is necessary to leave a flexible circuit board (FPC) binding position at the splicing of adjacent printed circuit boards, which will cause the LED area light source to have a very wide frame (usually in the centimeter level), thereby affecting the resolution and display effect of the display product.

The inventor found that the signal circuit for driving the LED can be prepared on a large-size glass substrate to form a non-spliced large-size area light source to reduce the production cost. However, the texture of the glass substrate is relatively brittle, and the stress generated when a relatively thick copper layer is formed on the glass substrate will cause the glass substrate to fragment.

In order to reduce the stress generated when a relatively thick copper layer is formed, a plurality of patterning processes can be used to form a plurality of thinner copper layers, and a plurality of thinner copper layers can form a relatively thick copper layer. However, this will result in a large number of patterning processes for preparing the driving substrate, affect the production cycle of the driving substrate, and result in high production costs of the driving substrate.

The embodiments of the present disclosure provide a driving substrate, a method for preparing the same, and a display device, that are capable of reducing the number of the patterning process for preparing the driving substrate.

An embodiment of the present disclosure provides a driving substrate, including: base substrate; a stress buffer layer located on the base substrate; a plurality of first wirings located on a surface of the stress buffer layer away from the base substrate, the plurality of first wirings having a first thickness; a first insulating layer located on a surface of the first wiring away from the base substrate; a plurality of second wiring structures located on a surface of the first insulating layer away from the base substrate, each of the plurality of first wirings being connected to at least one of the plurality of second wiring structures through a first via hole penetrating through the first insulating layer, the plurality of second wiring structures having a second thickness, and the second thickness being less than the first thickness; a second insulating layer located on a surface of the plurality of second wiring structures away from the base substrate; an electronic element located on a surface of the second insulating layer away from the base substrate, the electronic element being connected to the plurality of second wiring structures through a second via hole penetrating through the second insulating layer.

By providing a stress buffer layer, the stress generated when the conductive layer is formed on the base substrate can be relieved, so that the base substrate will not be fragmented. In this way, a relatively thick conductive layer can be formed on the base substrate, and a conductive layer having a larger thickness is used to prepare a first wiring having the first thickness through a single patterning process. A relatively large thickness of the first wiring can meet the requirements on the resistivity of the driving substrate to the wiring, and can drive the electronic element arranged on the base substrate, thereby achieving a large-size driving substrate. In this way, there is no need to form the first wiring having the first thickness through several patterning processes, thereby reducing the number of patterning process for preparing the driving substrate.

Specifically, the first thickness may be greater than 1 μm.

Among them, the greater the thickness of the conductive layer, the greater the stress generated when the conductive layer is formed, and the greater the thickness of the stress buffer layer, that is, the thickness of the stress buffer layer is positively correlated with the thickness of the first wiring. For example, when the first thickness is 2 μm, the stress buffer layer may have a thickness of 1500 angstroms; and when the first thickness is 5 μm, the stress buffer layer may have a thickness of 3000 angstroms.

In order to avoid short circuits, the orthogonal projection of the first via hole on the base substrate does not exceed the orthogonal projection of the first wiring on the base substrate, that is, the aperture of the orthogonal projection of the first via hole on the base substrate is not greater than the line width of the orthogonal projection of the first wiring on the base substrate. The base substrate may be a glass substrate or a quartz substrate. The size of the base substrate can reach 3 m×3 m or more, so that the technical solution of the present disclosure can achieve mass production of large-sized driving substrates. The electronic element may be an LED having a size in the micron level, that is, the technical solution of the present disclosure can realize a large-sized LED substrate.

In order to increase the density of electronic elements on the driving substrate, the second wiring structure may include at least one second wiring layer, and each of the at least one second wiring layer includes a plurality of second wirings, in which an insulating layer is arranged between the two adjacent second wiring layers, and in a direction away from the base substrate, each of the second wirings in a previous second wiring layer is connected to at least one of the second wirings in a next second wiring layer, and each of the second wirings in the last second wiring layer is connected to at least one of the electronic elements.

In order to avoid short circuits, the orthogonal projection of the second via hole on the base substrate does not exceed the orthogonal projection of the second wiring on the base substrate, that is, the aperture of the orthogonal projection of the second via hole on the base substrate is not greater than the line width of the orthogonal projection of the second wiring on the base substrate. In a specific embodiment, the wiring structure may include a first wiring layer and a second wiring layer, in which the first wiring layer includes a plurality of first wirings insulated from each other, and the second wiring layer includes a plurality of second wirings insulated from each other, each of the first wirings being connected to at least one of the second wirings through a via hole penetrating through the first insulating layer, and each of the second wirings being connected to at least one electronic element through a via hole penetrating through the second insulating layer.

In this embodiment, the first wiring can be connected to a plurality of second wirings. The first wiring transmits a large current, and thus the thickness of the first wiring is relatively large; and the second wiring is mainly used to connect electronic elements, and the current transmitted by the second wiring is relatively small as compared to the current transmitted by the first wiring, and thus the thickness may also be relative small. Specifically, the second thickness may be in a range from 0.6 to 0.9 μm.

Figure 7:
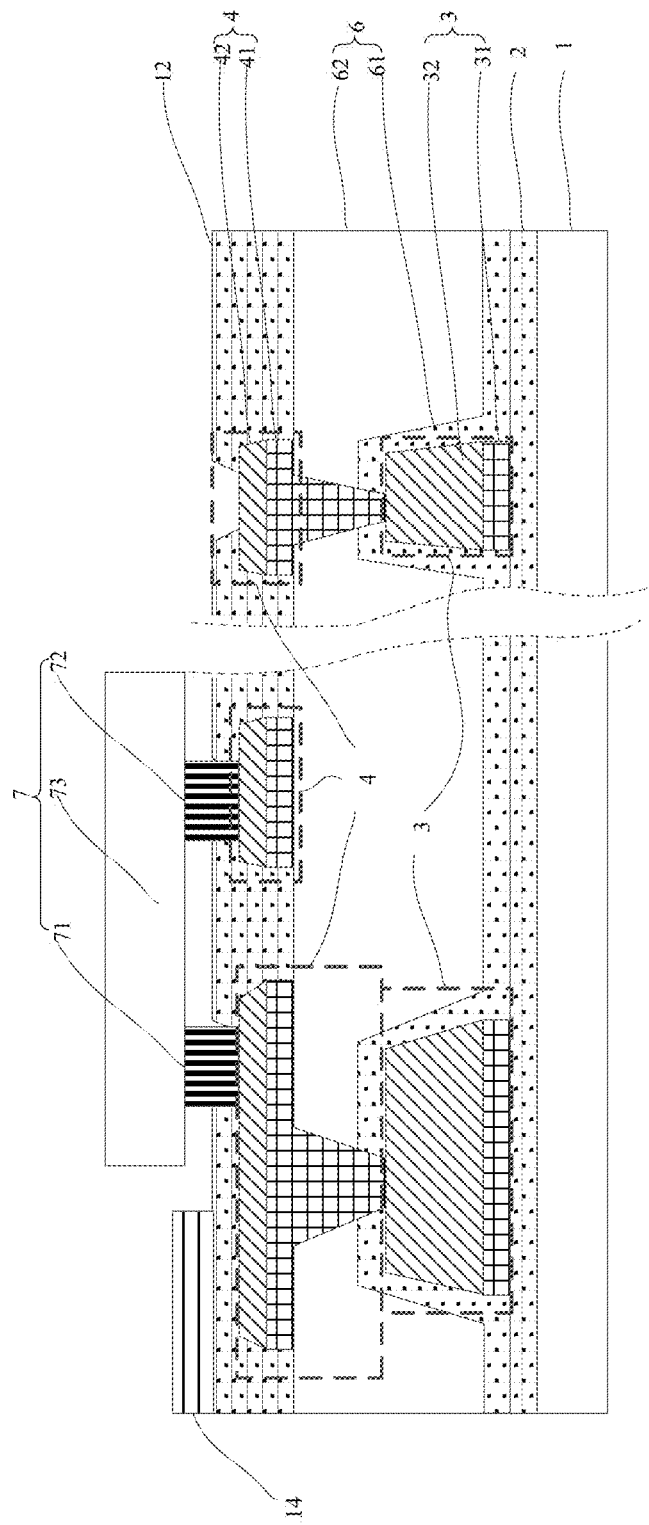

FIG. 1 is a schematic plan view showing the display area of the driving substrate according to an embodiment of the disclosure. The driving substrate includes a display area and a fan-out area located at the periphery of the display area as shown in FIG. 1. The left half of FIG. 7 is a schematic cross-sectional view showing the display area of the driving substrate in the DD' direction as shown in FIG. 1, in which the right half of FIG. 7 is a schematic cross-sectional view showing the fan-out area of the driving substrate, in which the display area is provided with an electronic element for emitting light; and the fan-out area is used for bonding the flexible circuit board or printed circuit board. As shown in FIG. 7, in a specific embodiment, taking the electronic element as an LED as an example, the driving substrate includes: a base substrate 1; a stress buffer layer 2 located on the base substrate 1; a first wiring 3 located on the stress buffer layer 2, the first wiring 3 being composed of a first metal layer 31 and a copper layer 32; the first insulating layer 6 covering the first wiring 3, the first insulating layer 6 including a first inorganic insulating layer 61 and a first organic insulating layer 62; a second wiring 4 located on the first insulating layer 6, the second wiring 4 being composed of a second metal layer 41 and a copper layer 42; a second insulating layer 12 covering the second wiring 4; an LED 7 located on the second insulating layer 12, the LED 7 being connected to the second wiring 4 through a via hole penetrating through the second insulating layer 12, in which the second wiring 4 can be connected to a plurality of LEDs 7 to connect adjacent LEDs 7. As shown in FIG. 7, each LED 7 includes an epitaxial layer 73 and N pad 71 and P pad 72.

The N pad 71 and P pad 72 of the LED 7 are respectively connected to the second wirings 4 located at different positions through the via hole penetrating through the second insulating layer 12.

Specifically, as shown in FIG. 1, the second wiring 4 is divided into a plurality groups arranged in an array. In some embodiments, each group of second wirings 4 is connected to four LEDs 7, and each group of second wirings 4 can be roughly distributed along a square ring. Of course, each group of second wirings 4 is not limited to forming a ring, and other shapes are also possible.

Figure 2:
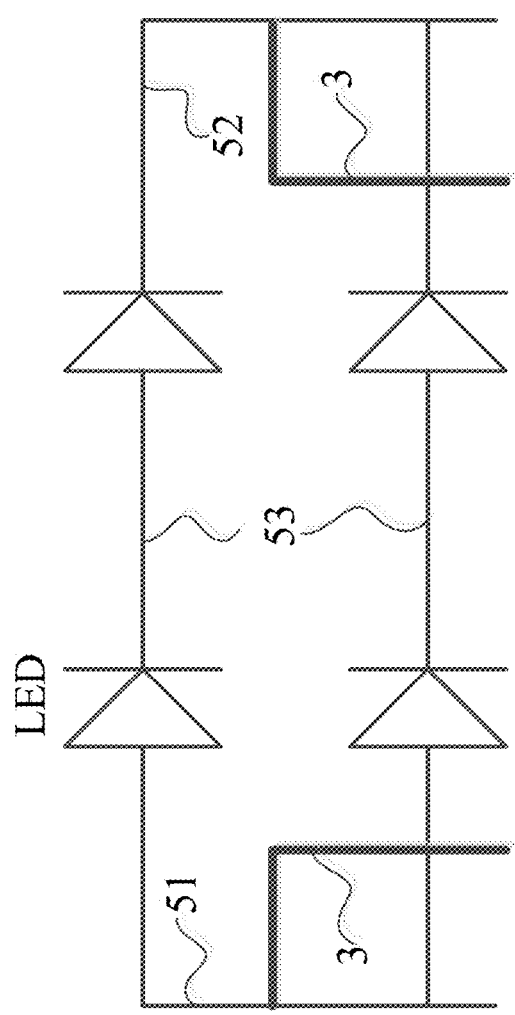
FIG. 2 is an equivalent circuit diagram showing part C in FIG. 1.

FIG. 2 is an equivalent circuit diagram of part C in FIG. 1. As shown in FIG. 2, each group of second wiring 4 includes an anode wiring 51, a connecting wiring 53, and a cathode wiring 52, and each group of second wiring 4 is connected to four LEDs and four LEDs are connected in two in series and two in parallel, in which the anode wiring 51 is connected to the anodes of the two LEDs, the cathode wiring 52 is connected to the cathodes of the two LEDs, and the connecting line 53 is connected to the anode of one LED and the cathode of the adjacent LED.

Since the current load of the driving substrate is large and can reach tens of milliamps, it has high requirements on the resistance performance of the wiring. It is necessary to use a metal having a lower resistance, otherwise the heat generated by the wiring will cause the temperature to be too high; and copper has superior conductivity. Therefore, copper is used as the main body of the first wiring 3. Of course, the first wiring 3 is not limited to be made of copper, and other metals, such as silver, and aluminum, can also be used. As shown in FIG. 7, the first wiring 3 includes a copper layer 32. The thickness of the copper layer 32 can be adjusted according to the size of the current load. The greater the current load, the greater the thickness of the copper layer 32. The thickness of the copper layer 32 may be in a range from 1 to 30 μm, and in some embodiments, it may be 2 μm. The copper layer 32 can be completed by sputtering, electroplating, electroless plating, etc. The stress buffer layer 2 can be made of one or more insulating materials of silicon nitride, silicon oxide and silicon oxynitride, and is opposite to the stress direction of the seed layer to be formed, so that the stress generated when the copper layer 32 is formed can be offset, thereby avoiding the fragmentation of the base substrate 1. The thickness of the stress buffer layer 2 may be 500 to 3000 angstroms.

Compressive stress refers to the stress that resists the compressive tendency of the object, and tensile stress refers to the reacting force of an object to an external force that tends to stretch the object. The direction of compressive is opposite to the direction of tensile stress, and as the thickness of the film increases, the stress becomes larger. The copper layer 32 exhibits tensile stress, and the stress buffer layer 2 exhibits compressive stress. Taking the stress buffer layer 2 using silicon nitride as an example, a layer of silicon nitride showing compressive stress is first deposited on the base substrate, and then a copper layer showing tensile stress is deposited. Since the stress direction of the stress buffer layer is opposite to that of the copper layer and the stress is offset, the warpage of the base substrate can be greatly reduced. Experiments have verified that a copper layer having a thickness of 3 μm can be formed on the base substrate by adding a stress buffer layer. At this time, the warpage of the base substrate is only equivalent to the warpage of the base substrate when a copper layer having a thickness of 1 μm is formed on the base substrate without a stress buffer layer, and a copper layer having a thickness of 3 μm can be used to prepare the first wiring 3 whose resistance performance meets the requirements. Therefore, the copper layer having a thickness of 3 μm can be used to prepare the first wiring through a single patterning process, and there is no need to separately form a plurality of thinner copper layers through several patterning processes to form the thicker first wiring 3.

In some embodiments, as shown in 7, the first wiring 3 further includes a first metal layer 31 located on the surface of the copper layer 32 proximate to the base substrate 1. The adhesion force between the first metal layer 31 and the stress buffer layer 2 is greater than the adhesion force between the copper layer 32 and the stress buffer layer 2, so that the first metal layer 31 can increase the adhesion force between the first wiring 3 and the stress buffer layer 2, and prevent the first wiring 3 from being peeled off the base substrate 1. Specifically, the first metal layer 31 may be made of at least one of Mo, MoNb, MoTi, MoW, MoNi, MoNiTi, and may also be made of metal oxides such as IGZO, IZO, GZO, and ITO. The thickness of the first metal layer 31 does not need to be set larger, and may be in a range from 200 to 500 angstroms.

The surface of the copper layer 32 is easily oxidized when exposed to air, thereby affecting the conductivity. In some embodiments, the first wiring 3 may also include a first conductive protection layer located on the surface of the copper layer 32 away from the base substrate 1, and the conductive protective layer may be made of a metal or a transparent conductive material that is not easily oxidized. Specifically, the first conductive protective layer may be made of at least one of Mo, MoNb, MoTi, MoW, MoNi, MoNiTi. The first conductive protection layer can prevent oxidation of the surface of the copper layer 32, and the thickness of the first conductive protection layer may be in a range from 50 to 500 angstroms.

The first wiring 3 is covered with a first insulating layer 6. As shown in FIG. 7, the first insulating layer 6 includes a first inorganic insulating layer 61. The first inorganic insulating layer 61 may be made of inorganic insulating materials, such as silicon nitride, silicon oxide, silicon oxynitride, etc., to protect the first wiring 3 from being oxidized in the subsequent high-temperature process, and the thickness of the first inorganic insulating layer 61 can be in a range from 500 to 3000 angstroms. Due to process limitations, the thickness of the first inorganic insulating layer 61 is relatively small and less than the thickness of the first wiring 3, it cannot satisfy the requirement on planarization. The first insulating layer 6 further includes a first organic insulating layer 62. The first organic insulating layer 62 can be made of a relatively thick organic insulating material, such as organic resin, to fill the recesses between the patterns of the first wirings 3 and provide a flat surface to the subsequent process, thereby avoiding large step differences in the subsequent process. In this way, LED displacement problem does not occur during the binding LED. The total thickness of the first insulating layer 6 should be greater than or equal to the thickness of the first wiring 3, and may be in a range from 1 to 30 μm.

The second wiring 4 is arranged on the first insulating layer 6. Since the second wiring 4 functions to connect the anode and/or cathode pins of each LED, the thickness of the second wiring 4 does not need to be too large, and can be in a range from 3000 to 9000 angstroms, specifically 6000 angstroms. Since copper has superior electrical conductivity, copper can be used to prepare the second wiring 4. As shown in FIG. 7, the second wiring 4 includes a copper layer 42, and the copper layer 42 can be completed by low-temperature deposition, sputtering, electroplating, chemical plating, or the like. In some embodiments, as shown in FIG. 7, the second wiring 4 further includes a second metal layer 41 located on the surface of the copper layer 42 proximate to the base substrate 1, and the adhesion force between the second metal layer 41 and the first insulating layer 6 is greater than the adhesion force between the copper layer 42 and the first insulating layer 6, so that the second metal layer 41 can increase the adhesion force between the second wiring 4 and the first insulating layer 6, and prevent the second wiring 4 from being peeled off the base substrate 1. Specifically, the second metal layer 41 can be made of at least one of Mo, MoNb, MoTi, MoW, MoNi, MoNiTi, or may also be made of metal oxides, such as IGZO, IZO, GZO, and ITO. The thickness of the second metal layer 41 does not need to be set larger, and may be in a range from 200 to 500 angstroms.

Figure 11:
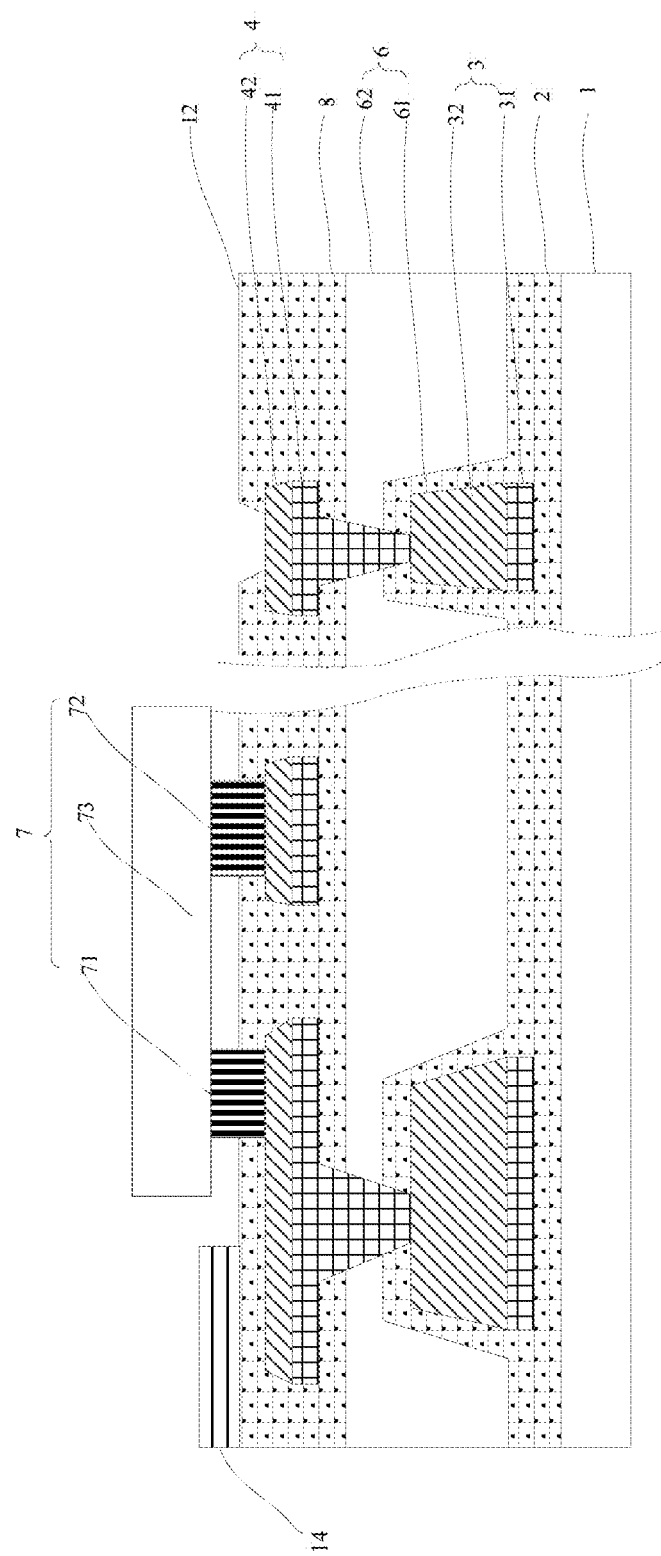

If the second wiring 4 is formed on the first insulating layer 6 by sputtering, the plasma during sputtering may damage the first organic insulating layer 62, so that the first organic insulating layer 62 has the phenomenon of falling off of debris, and the falling off debris will contaminate the sputtering chamber. In order to avoid this situation, as shown in FIG. 11, the driving substrate further includes a fourth inorganic insulating layer 8 located on the first insulating layer 6, in which the fourth inorganic insulating layer 8 can protect the first organic insulating layer 62. The fourth inorganic insulating layer 8 can be made of inorganic insulating materials, such as silicon nitride, silicon oxide, silicon oxynitride, etc., and the thickness of the fourth inorganic insulating layer 8 can be in a range from 500 to 3000 angstroms.

If the second wiring 4 is formed by low-temperature deposition, the process for forming the fourth inorganic insulating layer 8 can be omitted, since the low-temperature deposition will not cause damage to the first organic insulating layer 62.

Figure 13:
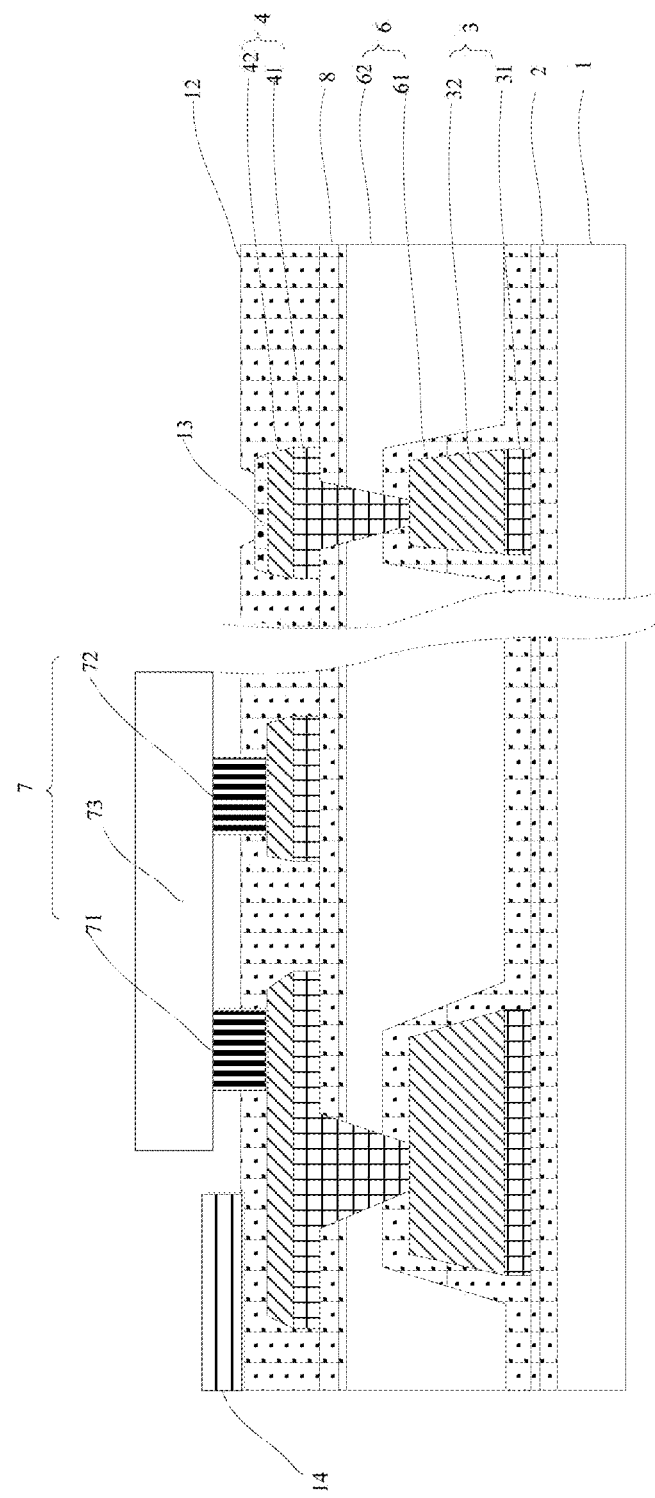

Before the LED is transferred to the substrate, the exposed surface of the second wiring 4 in the display area will be covered with solder paste, and then the LED to be bound can be soldered on the substrate through a reflow soldering process. The exposed surface of the second wiring 4 in the fan-out area B is not covered by solder paste, and oxidation will occur during reflow soldering, thereby affecting the conductivity of the second wiring 4. To avoid this problem, as shown in FIG. 13, the second conductive protective layer 13 is provided on a surface of the second wiring 4 in the fan-out area away from the base substrate 1. The second conductive protective layer 13 can be made of a metal or alloy that is not easily oxidized, or a transparent conductive material such as ITO, and the second conductive protective layer 13 can protect the second wiring 4 in the fan-out area.

The light emitted by the LED 7 is directed in all directions, only a part of the light is emitted toward the light emitting surface of the driving substrate. The light emitting surface of the driving substrate is the surface of the LED 7 away from the base substrate 1. In order to improve the utilization rate of light, the light incident on the reflective pattern 14 from the LED 7 can be reflected to the light emitting side through the reflective pattern 14, thereby improving the light utilization rate of the driving substrate. In some embodiments, as shown in FIG. 7, FIG. 11 and FIG. 13, the driving substrate further includes: a reflective pattern 14 located on the surface of the second insulating layer 12 away from the base substrate 1, in which the orthogonal projection of the reflective pattern 14 on the base substrate 1 does not overlap the orthogonal projection of the LED 7 on the base substrate 1, and the minimum horizontal distance between the orthogonal projection of the reflective pattern 14 and the edge of the orthogonal projection of the LED 7 can be about 100 μm. The material of the reflective pattern 14 can be white ink, which is formed by screen printing, inkjet printing, etc.; and the material of the reflective pattern 14 can also be a metal, which is formed by a patterning process. It is understandable that the reflective pattern 14 may also include a portion arranged on the surface of the LED 7 facing the base substrate 1, to further increase the reflectivity of light.

In some embodiments of the present disclosure, the second insulating layer 12 may only include one inorganic insulating layer for protecting the second wiring 4, but the thickness of the inorganic insulating layer is generally equal to or less than 6000 angstroms, and thus the protection effect on the second wiring 4 is limited. In addition, before the LED is transferred, it is necessary to form solder paste on the exposed surface of the second wiring 4 by stencil printing. If the protection effect is insufficient, the second wiring 4 is easily damaged. Thus, the second insulating layer 12 may also include an organic insulating layer, in which the organic insulating layer is located on the surface of the inorganic insulating layer away from the base substrate 1. The thickness of the organic insulating layer is generally in a range from 1 to 3 μm, and specifically can be 2 um. At this time, the thickness of the insulating layer may be about 1000 angstroms. Since the thickness of the organic insulating layer is relatively large, the second wiring 4 can be better protected.

An embodiment of the present disclosure further provides a display device including the driving substrate as described above. The display device may be any product or component having a display function, such as a liquid crystal television, a liquid crystal display, a digital photo frame, a mobile phone, a tablet computer, etc., in which the display device further includes a flexible circuit board, a printed circuit board, and a backplane.

When the electronic element is an LED, the above-mentioned driving substrate can be used as an area light source of a display device.

The embodiment of the present disclosure also provides a method for preparing a driving substrate, including: providing a base substrate; forming a stress buffer layer on the base substrate; forming a first wiring on the stress buffer layer through a single patterning process, the first wiring having a first thickness; forming a first insulating layer covering the first wiring, and the first insulating layer including a first via hole that exposes the first wiring; forming a plurality of second wiring structure on the first insulating layer, in which each of the first wirings is connected to at least one of the second wiring structure through a first via hole penetrating through the first insulating layer, the plurality of second wiring structure having a second thickness, and the second thickness being less than the first thickness; forming a second insulating layer covering the plurality of second wiring structures, the second insulating layer including a second via hole exposing a part of a surface of the second wiring structure; forming an electronic element on the second insulating layer, the electronic element being connected to the plurality of second wiring structures through a second via hole penetrating through the second insulating layer.

In this embodiment, a stress buffer layer is arranged on the base substrate, in which the stress buffer layer can relieve the stress generated when the conductive layer is formed on the base substrate, so that the base substrate will not be fragmented. In this way, a conductive layer having a larger thickness can be formed on the base substrate, and a conductive layer having a larger thickness is used to prepare a first wiring having the first thickness through a single patterning process. A relatively large thickness of the first wiring can meet the requirements on the resistivity of the driving substrate to the wiring, and can drive the electronic element arranged on the base substrate, thereby achieving a large-size driving substrate. In this way, there is no need to form the first wiring having the first thickness through several patterning processes, thereby reducing the number of patterning process for preparing the driving substrate.

The method for preparing the driving substrate of this embodiment is used to prepare the driving substrate in the above embodiment.

In some embodiments, the forming the stress buffer layer includes: forming the stress buffer layer by depositing at least one material of silicon nitride, silicon oxide, and silicon oxynitride on the base substrate.

In some embodiments, a first conductive layer having a first thickness may be deposited on the stress buffer layer and patterning the first conductive layer, to form the first wiring. In other embodiments, a first conductive layer having a first thickness may be formed on the stress buffer layer by electroplating, and the first conductive layer may be patterned, to form the plurality of first wirings.

Since copper has good electrical conductivity and can meet the requirements on the wiring of the driving substrate, copper can be used to prepare the wiring of the driving substrate. Taking the wiring made of copper and LED as the electronic element as an example, in one embodiment, the method for preparing the driving substrate specifically includes the following steps.

Figure 3:
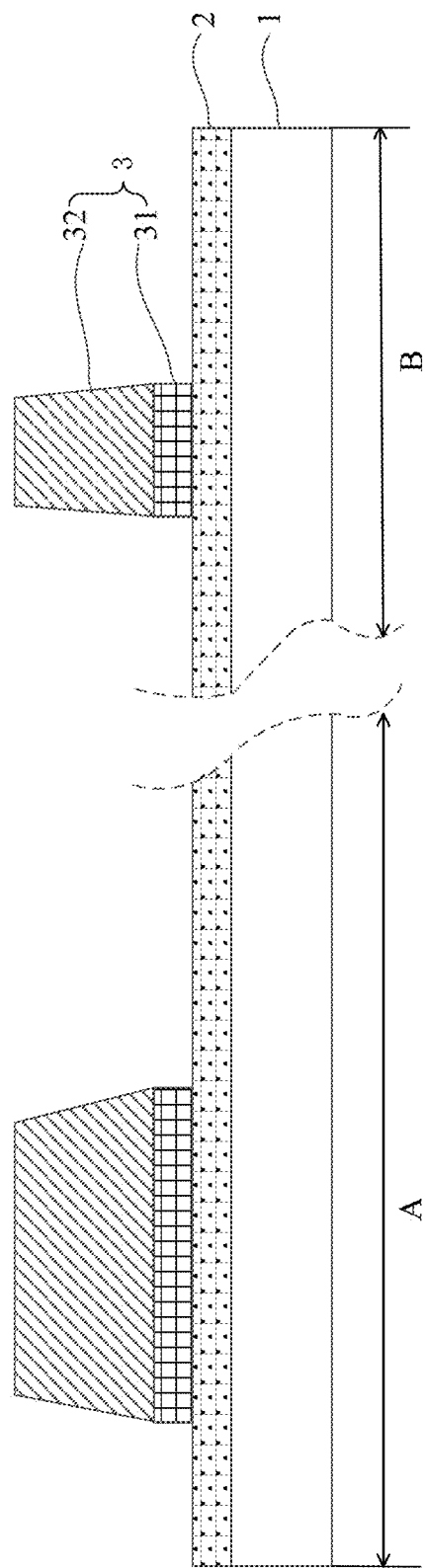

Step 1. As shown in FIG. 3, a base substrate 1 is provided, a stress buffer layer 2 is formed on the base substrate 1, and a first wiring 3 is formed on the stress buffer layer 2.

The base substrate 1 may be a glass substrate, a quartz substrate or a flexible substrate.

The stress buffer layer 2 can be made of one or more insulating materials from silicon nitride, silicon oxide and silicon oxynitride, and the stress direction of the stress buffer layer 2 is opposite to that of the copper layer 32 to be formed, so that the stress buffer layer 2 can offset the stress generated when the copper layer 32 is formed, thereby preventing the base substrate 1 from being fragmented. The thickness of the stress buffer layer 2 may be 500 to 3000 angstroms.

Since the adhesion force between the copper layer 32 and the stress buffer layer 2 is not too strong, the first metal layer 31 can be formed on the stress buffer layer 2 first, in which the adhesion force between the first metal layer 31 and the stress buffer layer 2 is greater than that between the copper layer 32 and the stress buffer layer 2. In this way, the first metal layer 31 can increase the adhesion between the first wiring 3 and the stress buffer layer 2, and prevent the first wiring 3 from being peeled off the base substrate 1. Specifically, the first metal layer 31 can be made of at least one of Mo, MoNb, MoTi, MoW, MoNi, MoNiTi, and also can be made of metal oxides, such as IGZO, IZO, GZO, and ITO. The thickness of the first metal layer 31 does not need to be set larger, and may be in a range from 200 to 500 angstroms.

A copper layer 32 is formed on the first metal layer 31. The copper layer 32 may be formed by sputtering, and the thickness of the copper layer 32 may be in a range from 1.0 to 2 μm.

The first metal layer 31 and the copper layer 32 are patterned together, to form a first wiring 3. As shown in FIG. 3, the driving substrate includes a display area A and a fan-out area B, in which the first wirings 3 are formed in both the display area A and the fan-out area B.

Since the surface of the copper layer 32 is easily oxidized when exposed to air, thereby affecting the conductivity, a first conductive protection layer can also be formed on the surface of the copper layer 32 away from the base substrate 1, and the conductive protective layer may be made of a metal or a transparent conductive material that is not easily oxidized. Specifically, the first conductive protective layer may be made of at least one of Mo, MoNb, MoTi, MoW, MoNi, MoNiTi. The first conductive protection layer can protect the copper layer 32 and prevent the surface of the copper layer 32 from being oxidized, and the thickness of the first conductive protection layer does not need to be set to be larger, and may be in a range from 50 to 500 angstroms.

Figure 4:
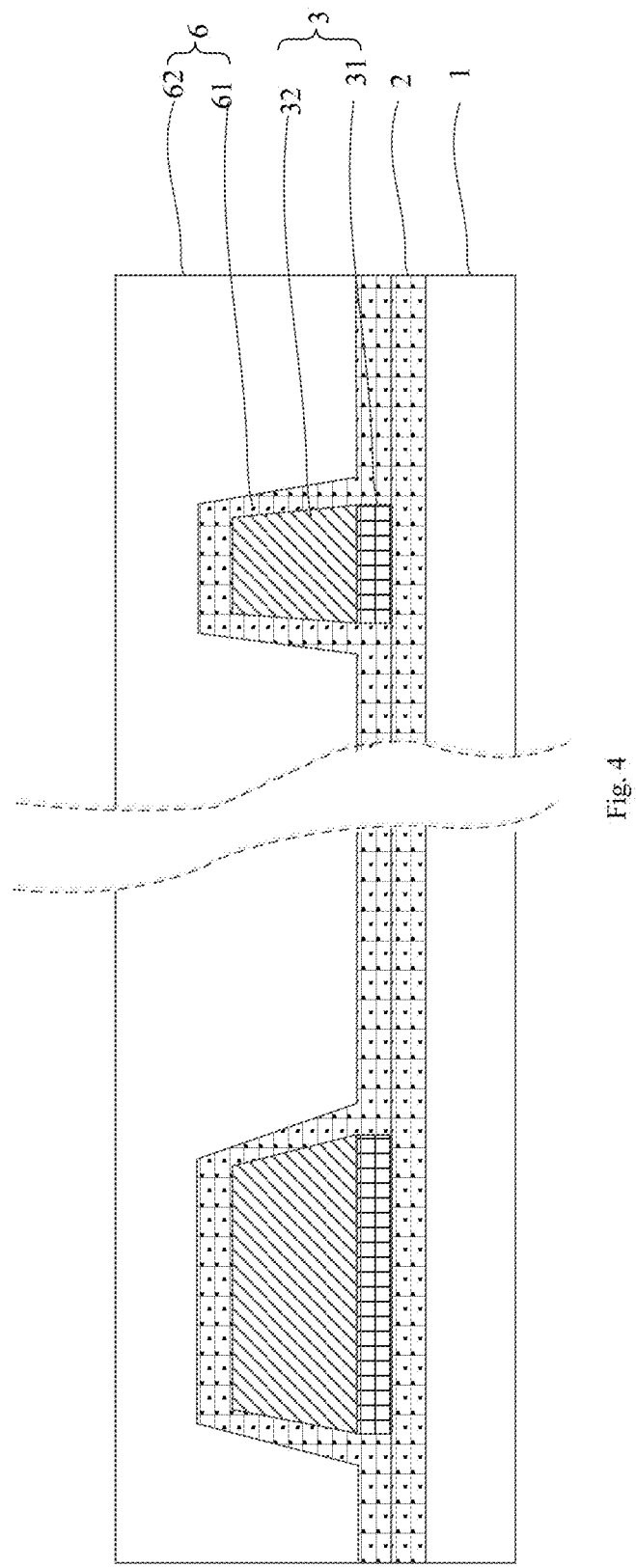

Step 2. As shown in FIG. 4, a first insulating layer 6 covering the first wiring 3 is formed.

The first insulating layer 6 may include a first inorganic insulating layer 61 and a first organic insulating layer 62. The first inorganic insulating layer 61 may be made of inorganic insulating materials, such as silicon nitride, silicon oxide, silicon oxynitride, etc., to protect the first wiring 3 from being oxidized in the subsequent high-temperature process, and the thickness of the first inorganic insulating layer 61 can be in a range from 500 to 3000 angstroms. Since the thickness of the first inorganic insulating layer 61 is relatively small and less than the thickness of the first wiring 3, it cannot satisfy the requirement on planarization. The first insulating layer 6 further includes a first organic insulating layer 62. The first organic insulating layer 62 can be made of a relatively thick organic insulating material, such as organic resin, to fill the gaps between the first wirings 3 and provide a flat surface to the subsequent process, thereby avoiding large step differences in the subsequent process. In this way, LED displacement problem does not occur during the binding LED, and the total thickness of the first insulating layer 6 should be greater than or equal to the thickness of the first wiring 3.

Step 3. As shown in FIG. 5, the first insulating layer 6 is patterned, to form a via hole exposing the first wiring 3, and a second wiring 4 is formed on the first insulating layer 6.

The first organic insulating layer 62 can be exposed and developed, to form a pattern of the first organic insulating layer 62 including the third via hole. The first inorganic insulating layer 61 is etched, e.g., dry etched, by using the pattern of the first organic insulating layer 62 as a mask, to form a pattern of the first inorganic insulating layer 61 including a fourth via hole, in which the third via hole communicates with the fourth via hole to form a first via hole penetrating first insulating layer 6, and the second wiring 4 formed subsequently is connected to the first wiring 3 through the first via hole. The first inorganic insulating layer 61 is etched by using the pattern of the first organic insulating layer 62 as a mask, thereby reducing the number of patterning process.

The thickness of the second wiring 4 does not need to be too large, and can be in a range from 3000 to 9000 angstroms. Since copper has superior electrical conductivity, copper can be used to prepare the second wiring 4. Of course, other conductive materials can also be used to prepare the second wiring 4.

As shown in FIG. 5, the second wiring 4 includes a second metal layer 41 and a copper layer 42. The second metal layer 41 and the copper layer 42 can be formed by low-temperature deposition. The low-temperature deposition will not damage the first organic insulating layer 62. The adhesion force between the second metal layer 41 and the first insulating layer 6 is greater than the adhesion force between the copper layer 42 and the first insulating layer 6, so that the second metal layer 41 can increase the adhesion force between the second wiring 4 and the first insulating layer 6, and prevent the second wiring 4 from being peeled off the base substrate 1. Specifically, the second metal layer 41 may be made of at least one of Mo, MoNb, MoTi, MoW, MoNi, MoNiTi. The thickness of the second metal layer 41 does not need to be set to be larger, and can be in a range from 50 to 500 angstroms, and the thickness of the copper layer 42 can be about 6000 angstroms.

The second metal layer 41 and the copper layer 42 are patterned together, to form the second wiring 4.

Step 4. As shown in FIG. 6, a second insulating layer 12 is formed.

The second insulating layer 12 may only include an inorganic insulating layer to protect the second wiring 4, but the thickness of the inorganic insulating layer is generally equal to or less than 6000 angstroms, and thus the protection to the second wiring 4 is not very good. When the LED is fixed on the driving substrate by transferring and bonding, a solder paste needs to be formed by stencil printing. When the protection effect is not good, the second wiring 4 is easily damaged. Therefore, the second insulating layer 12 may also include an inorganic insulating layer having a thickness of around 6000 angstroms, or may include one inorganic insulating layer and one organic insulating layer; the organic insulating layer is located on the surface of the inorganic insulating layer away from the base substrate 1, and the thickness of the organic insulating layer is generally around 2 μm. At this time, the thickness of the inorganic insulating layer may be about 1000 angstroms. Since the thickness of the organic insulating layer is relatively large, the second wiring 4 can be better protected.

When the second insulating layer 12 includes an inorganic insulating layer and an organic insulating layer, and when the second insulating layer is patterned, the organic insulating layer can be exposed and developed to form the pattern of the organic insulating layer, and then the inorganic insulating layer is etched (e.g., dry etched) by using the pattern of the organic insulating layer as a mask, to form the pattern of the inorganic insulating layer. The pattern of the second insulating layer 12 is composed of the pattern of the inorganic insulating layer and the pattern of the organic insulating layer, and the pattern of the second insulating layer 12 exposes the second wiring 4.

Step 5. As shown in FIG. 7, a reflective pattern 14 is formed on the second insulating layer, and the LED 7 is fixed on the substrate.

The light emitted by the LED 7 is directed in all directions. In order to improve the utilization rate of light, the light emitted by the LED 7 incident on the reflective pattern 14 can be reflected to the surface away from the base substrate 1 through the reflective pattern 14, to improve the light utilization rate of the driving substrate. The reflective pattern 14 can be made of white ink coated by screen printing, so there is no need to prepare the reflective pattern through a patterning process, thereby saving the number of patterning process. The reflective pattern 14 can also be formed by inkjet printing.

After that, LED 7 can be formed on the driving substrate through processes such as solder printing, die bonding, reflow soldering, and packaging. The LED 7 includes N pad 71 and P pad 72, in which the N pad 71 and P pad 72 of the LED 7 is respectively connected to the second wirings 4 located at different positions through the via hole penetrating through the second insulating layer 12.

Through the above steps, the driving substrate of the embodiment shown in FIG. 7 can be obtained. According to this embodiment, the driving substrate can be formed by four patterning processes, thereby reducing the number of patterning process for preparing the driving substrate and reducing the production cost of the driving substrate.

In another embodiment, for example, in the embodiment shown in FIG. 11, its difference from the embodiment shown in FIG. 7 lies in that the first insulating layer 6 not only includes the first inorganic insulating layer 61 and the first organic insulating layer 62, but also includes a fourth inorganic insulating layer 8 located on the surface of the first organic insulating layer 62 away from the base substrate 1.

Figure 8:
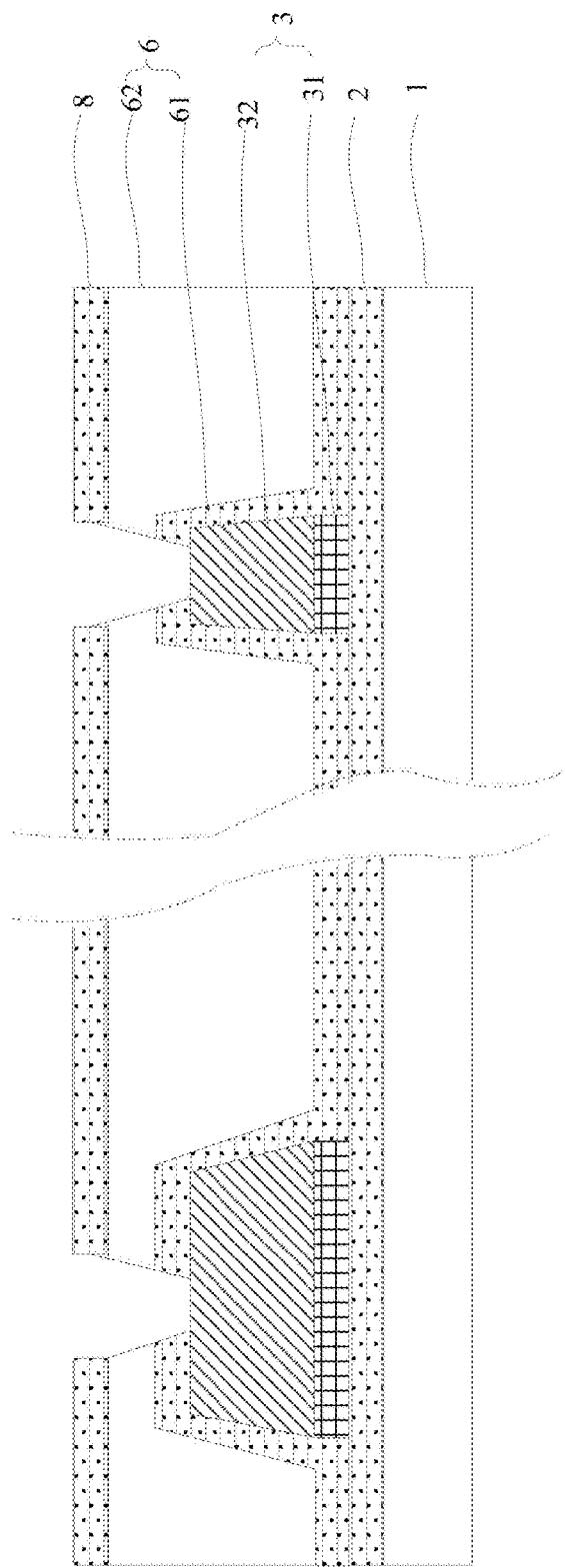
Figure 9:
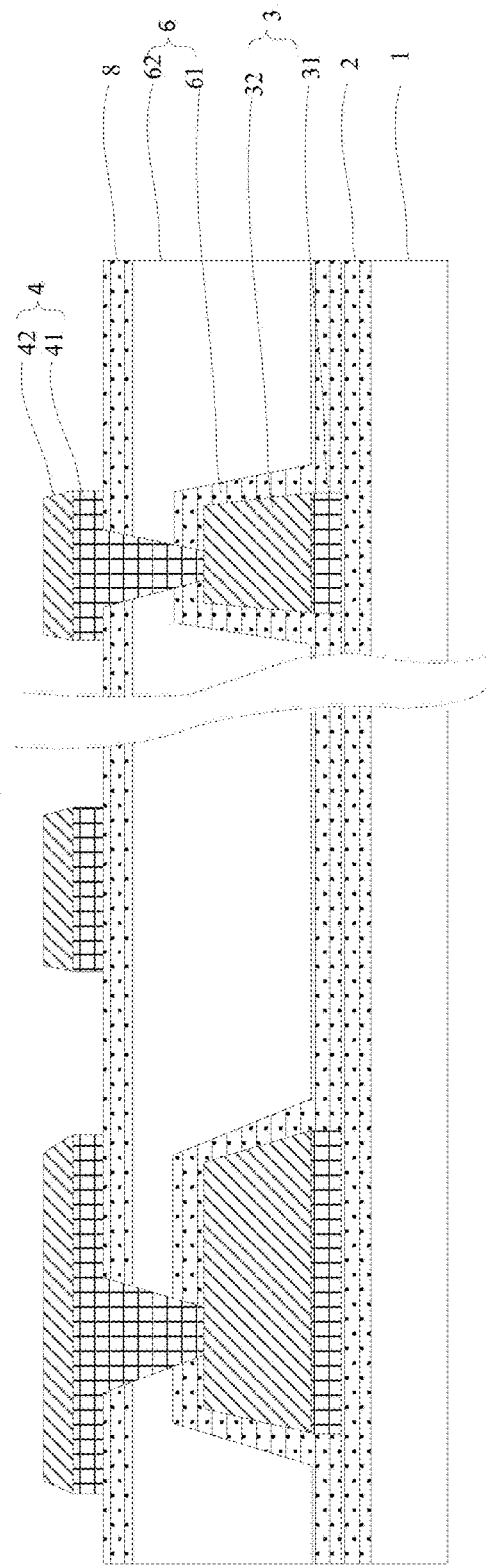
Figure 10:
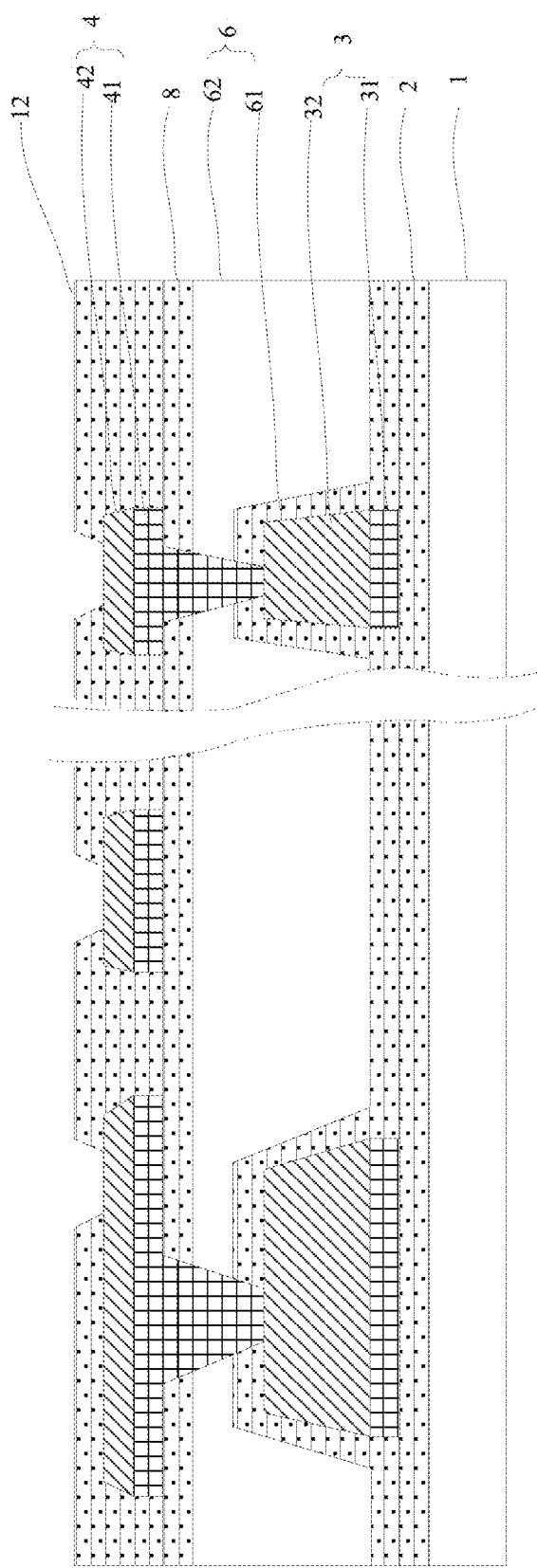

In the method for preparing the driving substrate shown in, for example, FIG. 11, a base substrate 1 is provided, a stress buffer layer 2 is formed, a first wiring 3 is formed, a first insulating layer 6 including a first inorganic insulating layer 61 and a first organic insulating layer 62 is formed and patterned (as shown in FIG. 8), a second wiring 4 is formed (as shown in FIG. 9), and a second insulating layer 12 is formed (as shown in FIG. 10). The reflective pattern 14 and the steps of the transferring and bonding LED 7 can be referred to the steps of the above-mentioned preparation, which will not be repeated herein. Moreover, between the steps of forming the first insulating layer 6 including the first inorganic insulating layer 61 and the first organic insulating layer 62 and the forming the second wiring 4, the method further includes the following steps.

As shown in FIG. 8, a fourth inorganic insulating layer 8 is formed, and the fourth inorganic insulating layer 8 is patterned, to form a via hole exposing the first wiring 3.

When the second wiring 4 is formed on the first insulating layer 6 by sputtering, the plasma during sputtering may damage the first organic insulating layer 62, so that the first organic insulating layer 62 has the phenomenon of falling off of debris, and the falling off debris will contaminate the sputtering chamber. In order to avoid this situation, a fourth inorganic insulating layer 8 is formed on the first insulating layer 6, in which the fourth inorganic insulating layer 8 can protect the first organic insulating layer 62. The fourth inorganic insulating layer 8 can be made of inorganic insulating materials, such as silicon nitride, silicon oxide, silicon oxynitride, etc., and the thickness of the fourth inorganic insulating layer 8 can be in a range from 500 to 3000 angstroms. The fourth inorganic insulating layer 8 is patterned to form a pattern of the fourth inorganic insulating layer 8 including a fifth via hole, in which the orthogonal projection of the fifth via hole on the base substrate 1 coincides with the orthogonal projection of the first via hole on the base substrate 1.

After the above steps, the driving substrate of the embodiment shown in FIG. 11 can be obtained through five patterning processes, thereby reducing the number of patterning process for preparing the driving substrate and reducing the production cost of the driving substrate.

Before the LED is transferred to the substrate, the exposed surface of the second wiring 4 in the display area will be covered with solder paste, and then the LED to be bound can be soldered on the substrate through a reflow soldering process. The exposed surface of the second wiring 4 in the fan-out area B is not covered by solder paste, and oxidation will occur during reflow soldering, thereby affecting the conductivity of the second wiring 4. To avoid this problem, after the forming the second wiring 4, the method for preparing the driving substrate further includes the following steps.

Figure 12:
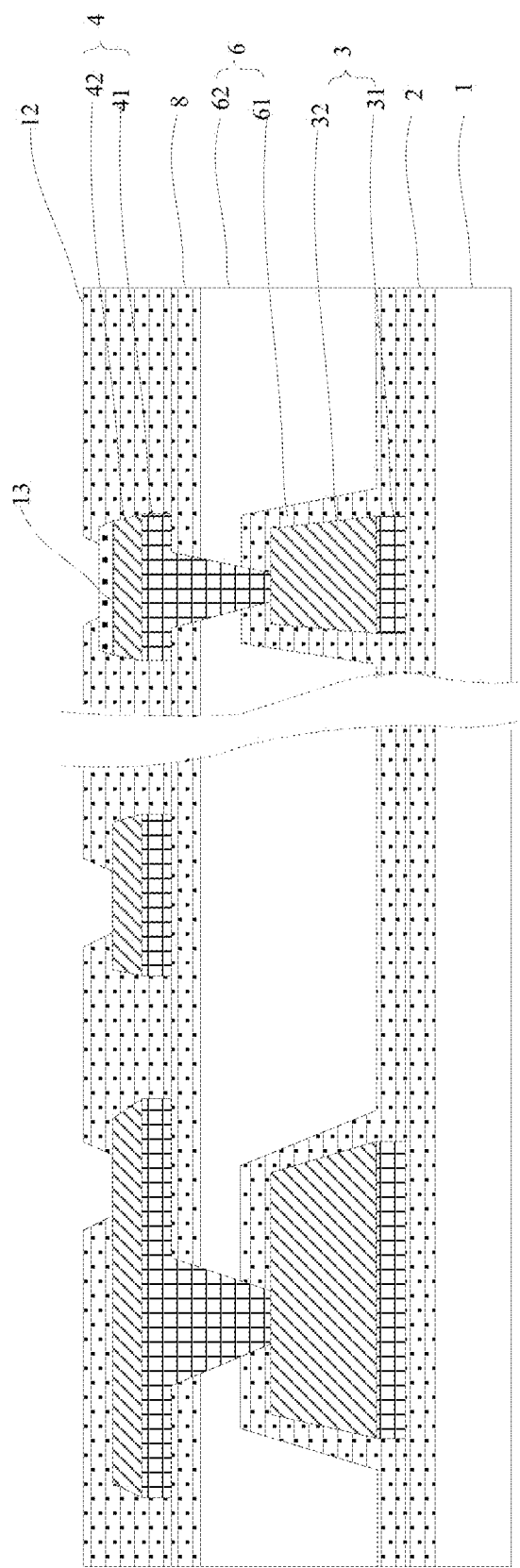

As shown in FIG. 12, a second conductive protection layer 13 covering the second wiring 4 of the fan-out area is formed. The second conductive protective layer 13 can be made of a metal or alloy that is not easily oxidized, and can also be made of a transparent conductive material such as ITO. If the second conductive protection layer 13 is formed on the surface of the second wiring 4 in the fan-out area away from the base substrate 1, a patterning process needs to be added.

Then, as shown in FIG. 13, the second insulating layer 12 may be formed, and the reflective pattern 14 and the LED 7 may be formed on the second insulating layer 12. The steps of forming the second insulating layer 12, the reflective pattern 14 and the LED 7 refer to the above-mentioned embodiments, which will not be repeated herein.

In another embodiment, the copper layer constituting the first wiring may be formed by electroplating, and the method for preparing the driving substrate specifically includes the following steps.

Figure 14:
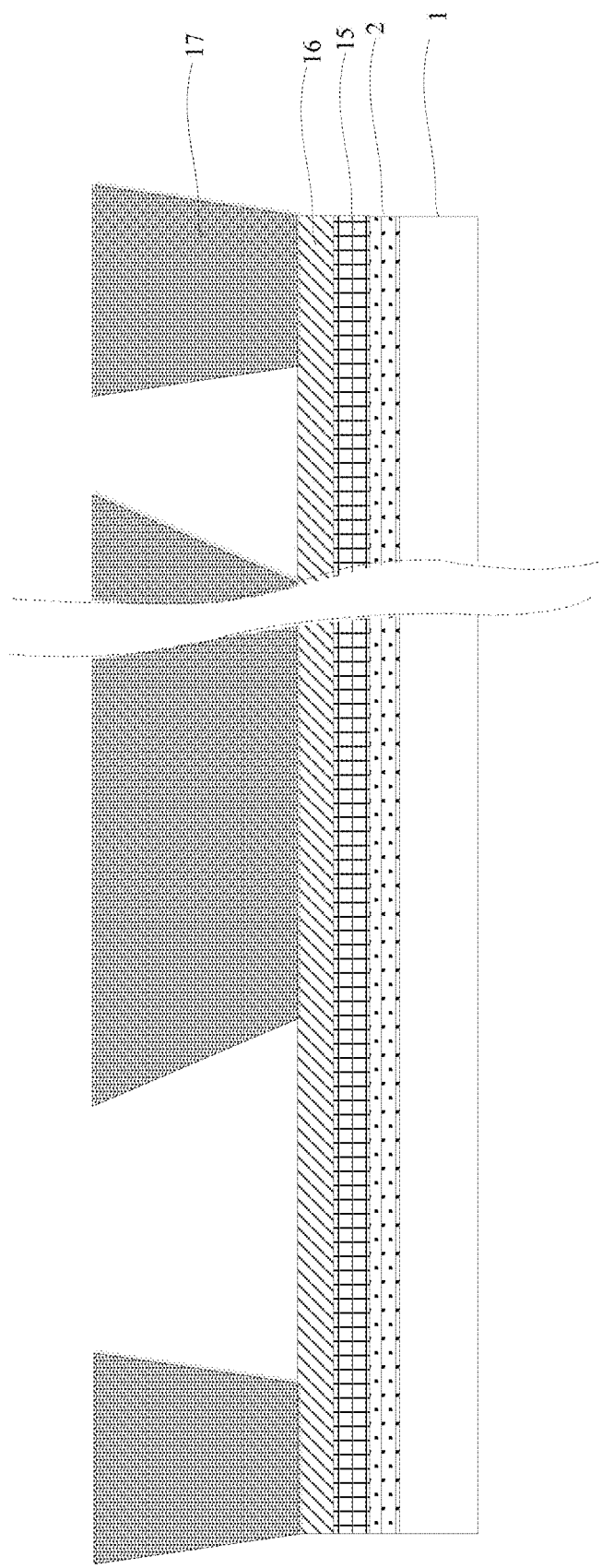

As shown in FIG. 14, a base substrate 1 is provided, a stress buffer layer 2 is formed on the base substrate 1, a seed layer is formed on the stress buffer layer 2, a negative photoresist is formed on the seed layer, and the photoresist is exposed and developed to form a photoresist removal area and a photoresist reserved area, thereby obtaining a photoresist pattern 17. The photoresist removal area corresponds to the first wiring to be formed, that is, the first wiring will be formed in the photoresist removal area. The base substrate 1 may be a glass substrate, a quartz substrate or a flexible substrate.

The stress buffer layer 2 can be made of one or more insulating materials from silicon nitride, silicon oxide and silicon oxynitride, and the stress direction of the stress buffer layer 2 is opposite to that of the seed layer to be formed, so that the stress buffer layer 2 can offset the stress generated when the seed layer is formed, thereby preventing the base substrate 1 from being fragmented. The thickness of the stress buffer layer 2 may be 500 to 3000 angstroms.

The seed layer can be formed by sputtering. The thickness of the seed layer is much smaller than the first thickness of the first wiring to be formed. The thickness of the seed layer can be in a range from 3000 to 6000 angstroms, so that the seed layer will not produce too much stress.

As shown in FIG. 14, the seed layer may include a first metal layer 15 and a copper layer 16. Since the adhesion force between the copper layer 16 and the stress buffer layer 2 is not too strong, the first metal layer 15 can be formed on the stress buffer layer 2 first. The adhesion force between the first metal layer 15 and the stress buffer layer 2 is greater than that between the copper layer 16 and the stress buffer layer 2. In this way, the first metal layer 15 can increase the adhesion force between the first wiring 3 and the stress buffer layer 2, and prevent the first wiring 3 from being peeled off the base substrate 1. Specifically, the first metal layer 15 can be made of at least one of Mo, MoNb, MoTi, MoW, MoNi, MoNiTi, and also can be made of metal oxides, such as IGZO, IZO, GZO, and ITO. The thickness of the first metal layer 15 does not need to be set larger, and may be in a range from 200 to 500 angstroms.

In this embodiment, a negative photoresist can be used to form the photoresist pattern 17, thereby forming a photoresist pattern 17 having an inverted trapezoidal structure, facilitating the subsequent formation of a copper layer with a positive trapezoidal structure, and thus facilitating the deposition of subsequent insulating layers. In order to facilitate subsequent removal of the photoresist, the thickness of the photoresist pattern 17 is not less than the thickness of the third conductive layer 18, preferably slightly larger than the thickness of the third conductive layer 18.

Of course, the technical solution of the present disclosure is not limited to the use of negative photoresist, and the photoresist pattern 17 can also be formed by use of a positive photoresist. If the positive photoresist is used to form the photoresist pattern 17, the slope angle of the photoresist pattern 17 is preferably greater than 80°.

Figure 15:
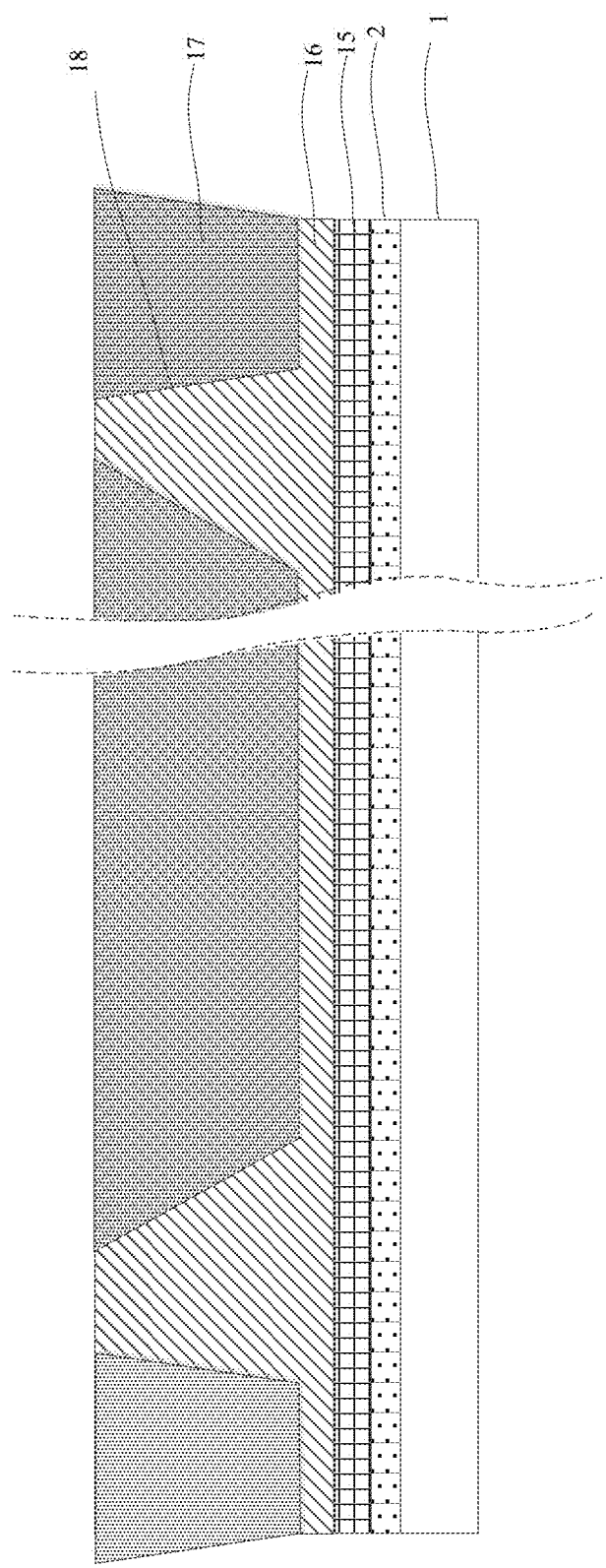

Step 2. As shown in FIG. 15, a third conductive layer 18 is grown by an electroplating on the seed layer where the photoresist pattern 17 is formed.

The third conductive layer 18 is formed by electroplating, When the third conductive layer 18 is made of copper, the stress generated by the copper layer formed by electroplating is small, and the speed of forming the copper layer is fast, and the third conductive layer 18 having a thickness in a range from 1.0 to 20 μm can be formed. As shown in FIG. 15, the third conductive layer 18 will not be formed in the area where the photoresist remains.

Step 3. The photoresist in the photoresist reserved area is removed, and the seed layer in the photoresist retention is etched, in which the first wiring 3 is composed of the third conductive layer and the seed layer in the photoresist removal area, as shown in FIG. 3.

After that, it further includes: forming and patterning the first insulating layer 6 including the first inorganic insulating layer 61 and the first organic insulating layer 62 (as shown in FIG. 8), forming and patterning the fourth inorganic insulating layer 8 (as shown in FIG. 8), forming the second wiring 4 (as shown in FIG. 9), and forming the second insulating layer 12 (as shown in FIG. 10). The reflective pattern 14 and the steps of the transferring and bonding LED 7 can be referred to the above-mentioned preparation method, which will not be repeated herein.

In another embodiment, the formed seed layer is patterned, and then the third conductive pattern 20 is grown on the pattern of the seed layer by electroplating. The method for preparing the driving substrate specifically includes the following steps.

Figure 16:
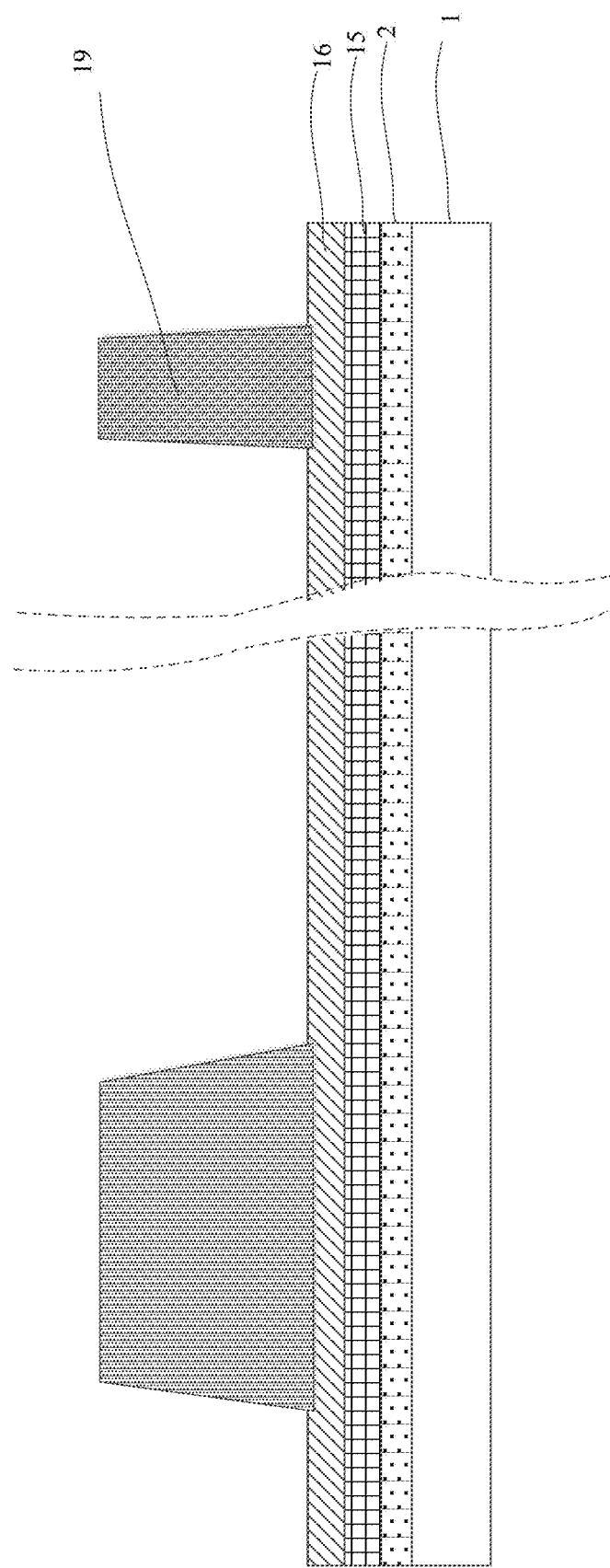

Step 1. As shown in FIG. 16, a base substrate 1 is provided, a stress buffer layer 2 is formed on the base substrate 1, a seed layer is formed on the stress buffer layer 2, in which the thickness of the seed layer is much less than the first thickness and generally several thousand angstroms, a photoresist is formed on the seed layer, the photoresist is exposed and developed to form a photoresist removal area and a photoresist reserved area, thereby obtaining a photoresist pattern 19. The photoresist pattern 19 defines the area of the first wiring to be formed later.

Figure 17:
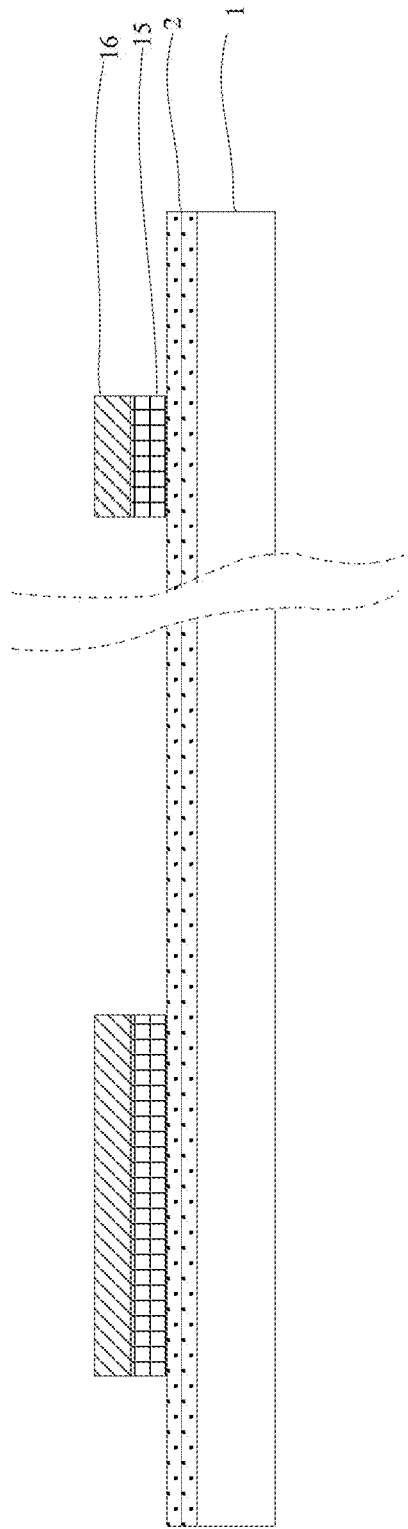

Step 2. As shown in FIG. 17, the seed layer in the photoresist removal area is etched, to remove the remaining photoresist to form a pattern of the seed layer.

Figure 18:
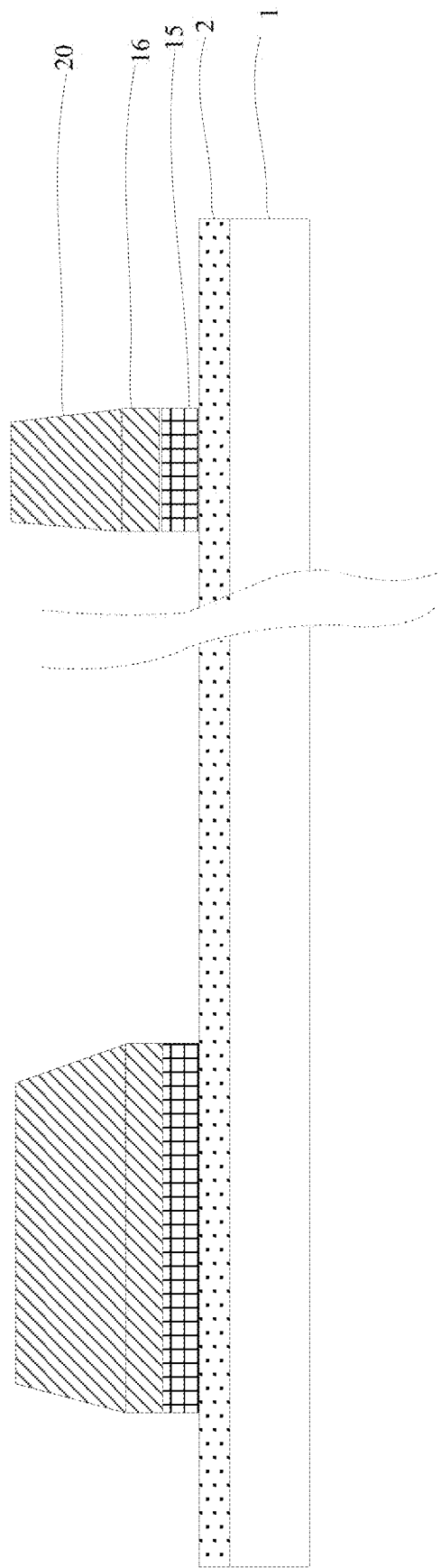

Step 3. As shown in FIG. 18, a third conductive pattern 20 is grown on the pattern of the seed layer by electroplating.

After that, the method further includes: forming and patterning the first insulating layer 6 including the first inorganic insulating layer 61 and the first organic insulating layer 62 (as shown in FIG. 8), forming and patterning the fourth inorganic insulating layer 8 (as shown in FIG. 8), forming the second wiring 4 (as shown in FIG. 9), and forming the second insulating layer 12 (as shown in FIG. 10), as well as steps for forming the reflective pattern 14 and transferring and bonding LED 7. The above steps can be referred to the above-mentioned preparation method, which will not be repeated herein.

After the above steps, the driving substrate of the embodiment shown in FIG. 11 can be obtained through five patterning processes, thereby reducing the number of patterning processes for preparing the driving substrate and reducing the production cost of the driving substrate.

In another embodiment, before the forming the first wiring 3, a part of a planarization layer may be formed first, and the method for prepare the driving substrate specifically includes the following steps.

Step 1. As shown in FIG. 16, a base substrate 1 is provided, a stress buffer layer 2 is formed on the base substrate 1, a seed layer is formed on the stress buffer layer 2, a photoresist is formed on the seed layer, the photoresist is exposed and developed to form a photoresist removal area and a photoresist reserved area, thereby obtaining a photoresist pattern 19. The photoresist pattern 19 corresponds to the first wiring to be formed, that is, after the first wiring is formed, the orthogonal projection of the first wiring on the base substrate 1 coincides with the orthogonal projection of the photoresist pattern 19 on the base substrate 1.

The base substrate 1 may be a glass substrate, a quartz substrate or a flexible substrate.

The stress buffer layer 2 can be made of one or more insulating materials from silicon nitride, silicon oxide and silicon oxynitride, and the stress direction of the stress buffer layer 2 is opposite to that of the seed layer to be formed, so that the stress buffer layer 2 can offset the stress generated when the seed layer is formed, thereby preventing the base substrate 1 from being fragmented. The thickness of the stress buffer layer 2 may be 500 to 3000 angstroms.

The seed layer can be formed by sputtering. The thickness of the seed layer is much smaller than the thickness of the first wiring to be formed. The thickness of the seed layer can be in a range from 3000 to 6000 angstroms, so that the seed layer will not produce too much stress.

As shown in FIG. 16, the seed layer may include a first metal layer 15 and a copper layer 16. Since the adhesion force between the copper layer 16 and the stress buffer layer 2 is not too strong, the first metal layer 15 can be formed on the stress buffer layer 2 first. The adhesion force between the first metal layer 15 and the stress buffer layer 2 is greater than that between the copper layer 16 and the stress buffer layer 2. In this way, the first metal layer 15 can increase the adhesion between the first wiring 3 and the stress buffer layer 2, and prevent the first wiring 3 from being peeled off the base substrate 1. Specifically, the first metal layer 15 can be made of at least one of Mo, MoNb, MoTi, MoW, MoNi, MoNiTi, and also can be made of metal oxides, such as IGZO, IZO, GZO, and ITO. The thickness of the first metal layer 15 does not need to be set larger, and may be in a range from 200 to 500 angstroms.

In this embodiment, a positive photoresist can be used to form the photoresist pattern 19. The thickness of the pattern 19 of the photoresist does not need to be too large, generally in a range from 1 to 3 μm, and can be 1.5 μm.

Step 2. As shown in FIG. 17, the seed layer in the photoresist removal area is etched, to remove the remaining photoresist to form a pattern of the seed layer.

Figure 19:
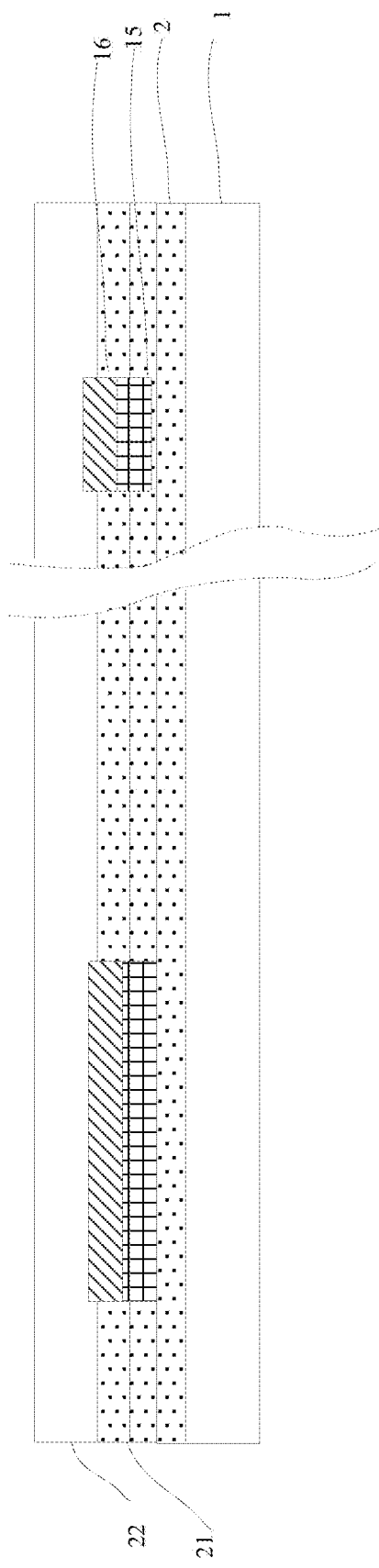

Step 3. As shown in FIG. 19, a third inorganic insulating layer 21 and a third organic insulating layer 22 are formed.

Figure 20:
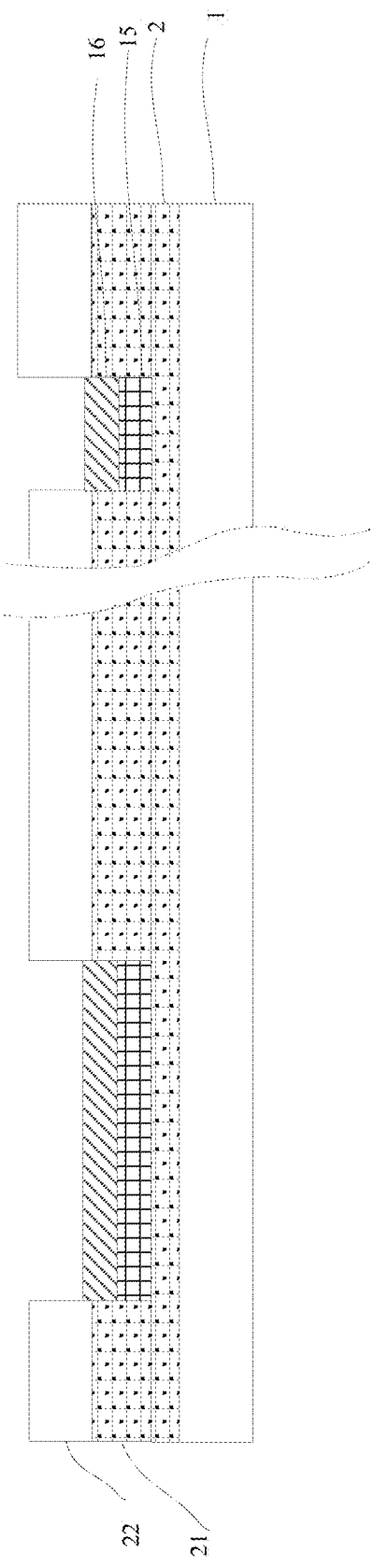

Step 4. As shown in FIG. 20, the patterns of the third inorganic insulating layer 21 and the third organic insulating layer 22 are formed by a single patterning process.

The third organic insulating layer 22 is first exposed and developed, to form a pattern of the third organic insulating layer 22, the pattern of the third organic insulating layer 22 including a third organic insulating layer reserved area and a third organic insulating layer removal area, and the organic insulating layer removal area coinciding with the area where the pattern of the seed layer is located; and the third inorganic insulating layer 21 is etched by using the pattern of the third organic insulating layer 22 as a mask, to form a pattern of the third inorganic insulating layer 21.

The patterns of the third inorganic insulating layer 21 and the third organic insulating layer 22 are used to provide a flat surface for subsequently forming the second wiring 4. In this embodiment, before the first wiring 3 is formed, a part of the planarization layer is formed, so that it is easier to perform the subsequent planarization.

Figure 21:
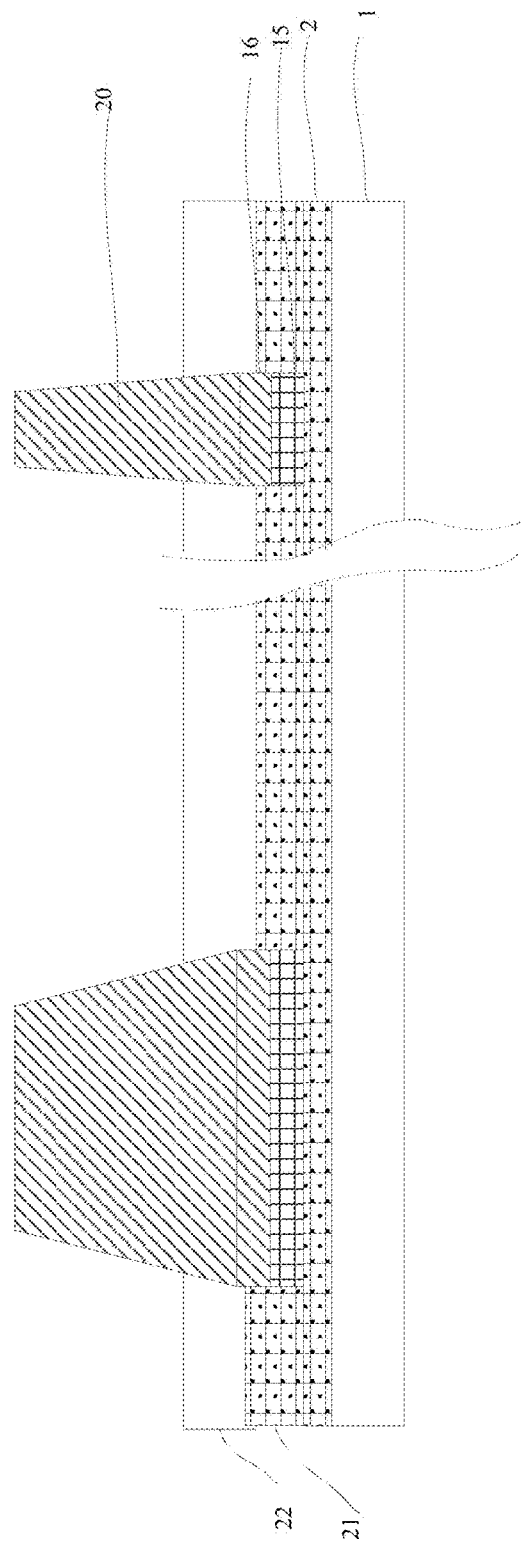

Step 5. As shown in FIG. 21, a third conductive pattern 20 is grown on the pattern of the seed layer by electroplating.

Since the seed layer is made of a copper layer, the third conductive pattern 20 grown is also a copper layer. The copper layer formed by electroplating has low stress, and the speed of forming the copper layer is fast, and a relatively thick copper layer can be formed. Specifically, a third conductive pattern 20 having a thickness in a range from 1.5 to 20 μm is formed. As shown in FIG. 20, the third conductive pattern 20 is not formed in the area where the pattern of the seed layer is not provided. The pattern of the seed layer and the third conductive pattern 20 constitute the first wiring 3.

Figure 22:
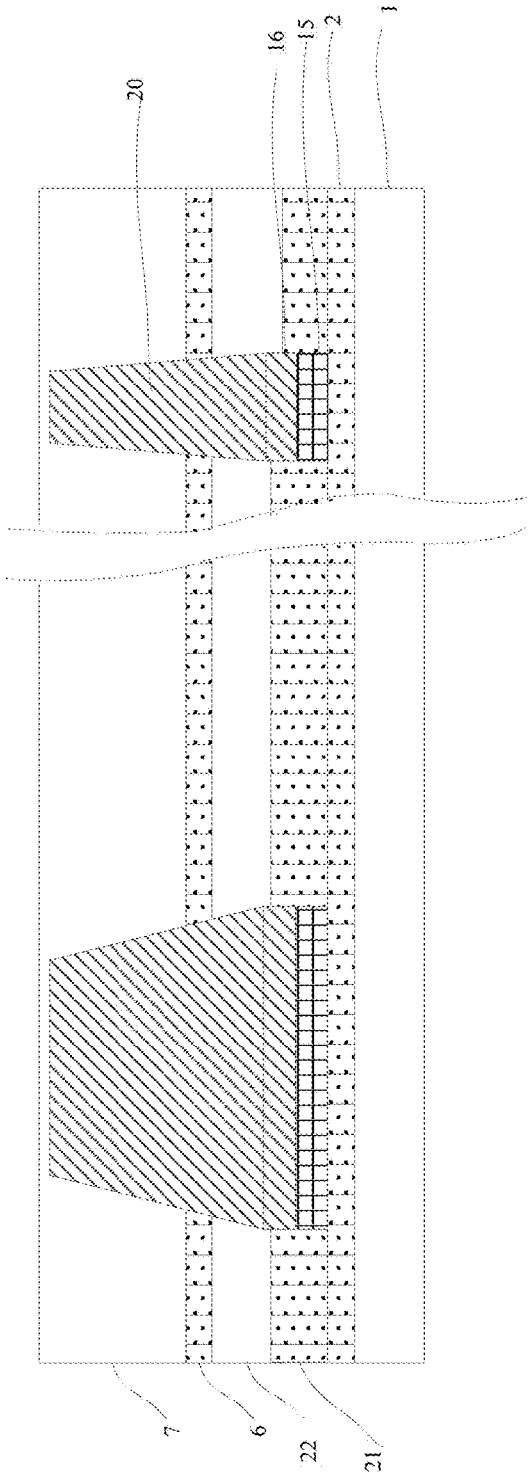

Step 6. As shown in FIG. 22, a first insulating layer 6 covering the first wiring 3 is formed.

The first insulating layer 6 may include a first inorganic insulating layer 61 and a first organic insulating layer 62. The first inorganic insulating layer 61 may be made of inorganic insulating materials, such as silicon nitride, silicon oxide, silicon oxynitride, etc., to protect the first wiring 3 from being oxidized in the subsequent high-temperature process, and the thickness of the first inorganic insulating layer 61 can be in a range from 500 to 3000 angstroms. Since the thickness of the first inorganic insulating layer 61 is relatively small and less than the thickness of the first wiring 3, it cannot satisfy the requirement on planarization. The first insulating layer 6 further includes a first organic insulating layer 62. The first organic insulating layer 62 can be made of a relatively thick organic insulating material, such as organic resin, to fill the gaps between the first wirings 3 and provide a flat surface to the subsequent process, thereby avoiding large step differences in the subsequent process. In this way, LED displacement problem does not occur during the binding LED.

Since the third inorganic insulating layer 21 and the third organic insulating layer 22 have been formed in advance, the thickness of the first insulating layer 6 does not need to be too large, and can be about 1.5 μm, as long as the total thickness of the third inorganic insulating layer 21, the third organic insulating layer 22 and the first insulating layer 6 may be greater than the thickness of the first wiring 3.

Furthermore, in this step, the first inorganic insulating layer 61 can also be omitted, and only the first organic insulating layer 62 can be retained.

After that, referring to the steps of the above embodiment, the first insulating layer 6 is patterned to form the second wiring 4, and then to form the pattern of the second insulating layer 12, and the reflective pattern 14 and the LED 7 are formed on the second insulating layer 12, thereby obtaining the driving substrate of this embodiment. According to this embodiment, the driving substrate can be formed by six patterning processes, thus the driving substrate can be prepared by a method having fewer patterning processes, and the production cost of the driving substrate can be reduced.

In the above embodiment, in order to avoid contamination of the metal deposition equipment in the process of directly depositing metal on the organic insulating layer to form the second wiring, the second wiring 4 can be formed by a low-temperature deposition process, and the fourth inorganic insulating layer 8 can be omitted, thereby reducing one patterning process. In the above embodiment, in order to avoid affecting the electroplating when the first wiring 3 is formed by electroplating, the first wiring 3 may only include the first metal layer and the copper layer, and does not need to include the first conductive protection layer.

In the method embodiments of the present disclosure, the serial numbers of the steps cannot be used to define the sequence of the steps. As for one skilled in the art, the changes in the order of steps without paying creative work also fall within the scope of the present disclosure.

Unless otherwise defined, technical terms or scientific terms used herein have the normal meaning commonly understood by one skilled in the art in the field of the present disclosure. The words "first", "second", and the like used herein does not denote any order, quantity, or importance, but rather merely serves to distinguish different components. The "including", "comprising", and the like used in the present disclosure means that the element or item appeared in front of the word encompasses the element or item and their equivalents listed after the word, and does exclude other elements or items. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly.

It will be understood that when an element, such as a layer, film, region, or substrate, is referred to as being "on" or "under" another element, the element may be directly "on" or "under" another element, or there may be an intermediate element.

The above description are preferred embodiments of the present disclosure. It should be noted that one skilled in the art would make several improvements and substitutions without departing from the principles of the present disclosure. These improvements and modifications should also be regarded as the protection scope of the present disclosure.

What is claimed is:

1. A driving substrate, comprising:
    a base substrate;
    a stress buffer layer located on the base substrate;
    a plurality of first wirings located on a surface of the stress buffer layer away from the base substrate, the plurality of first wirings having a first thickness;
    a first insulating layer located on a surface of the first wiring away from the base substrate;
    a plurality of second wiring structures located on a surface of the first insulating layer away from the base substrate, each of the plurality of first wirings being connected to at least one of the plurality of second wiring structures through a first via hole penetrating through the first insulating layer, the plurality of second wiring structures having a second thickness of more than 6000 angstroms to 9000 angstroms, and the second thickness being less than the first thickness;
    a second insulating layer located on a surface of the plurality of second wiring structures away from the base substrate, wherein the second insulating layer comprises an inorganic insulating layer and an organic insulating layer located on a surface of the inorganic insulating layer away from the base substrate; and
    an electronic element located on a surface of the second insulating layer away from the base substrate, the electronic element being directly connected to the plurality of second wiring structures through at least two second via holes penetrating through the second insulating layer, and an orthographic projection of the electronic element on the base substrate partially overlaps with orthographic projections of the plurality of second wiring structures on the base substrate,
    wherein an aperture of an orthogonal projection of the first via hole on the base substrate is not greater than a line width of an orthogonal projection of the first wiring on the base substrate; an aperture of an orthogonal projection of the second via hole on the base substrate is not greater than a line width of an orthogonal projection of the second wiring on the base substrate.

2. The driving substrate of claim 1, wherein the first wiring comprises a copper layer and a first metal layer that are stacked, the first metal layer is located on a surface of the copper layer proximate to the base substrate, and an adhesion force between the first metal layer and the stress buffer layer is greater than an adhesion force between the copper layer and the stress buffer layer.

3. The driving substrate of claim 2, wherein the copper layer has a thickness in a range from 1 to 30 µm.

4. The driving substrate of claim 2, wherein the first wiring further comprises a first conductive protection layer located on a surface of the copper layer proximate to the base substrate.

5. The driving substrate of claim 1, wherein the second wiring structure comprises at least one second wiring layer, and each of the at least one second wiring layer comprises a plurality of second wirings, in a situation that the at least one second wiring layer comprises several second wiring layers, an insulating layer is arranged between two adjacent second wiring layers, and in a direction away from the base substrate, each of the second wirings in a previous second wiring layer is connected to at least one of the second wirings in a next second wiring layer, and each of the second wirings in the last second wiring layer is connected to at least one of the electronic elements.

6. The driving substrate of claim 5, wherein the second wiring comprises a copper layer and a second metal layer that are stacked, the second metal layer is located on a surface of the copper layer proximate to the base substrate, and an adhesion force between the second metal layer and the first insulating layer is greater than an adhesion force between the copper layer and the first insulating layer.

7. The driving substrate of claim 5, wherein the driving substrate comprises a display area and a fan-out area located at a periphery of the display area, and the driving substrate further comprises:
    a second conductive protection layer covering the second wiring of the fan-out area.

8. The driving substrate of claim 1, wherein the first insulating layer comprises:
    a first inorganic insulating layer and a first organic insulating layer that are stacked, the first organic insulating layer being located on a surface of the first inorganic insulating layer away from the base substrate.

9. The driving substrate of claim 8, wherein the driving substrate further comprises:
    a fourth inorganic insulating layer located on the surface of the first organic insulating layer away from the base substrate, the second wiring structure being located on a surface of the fourth inorganic insulating layer away from the base substrate.

10. A display device, comprising the driving substrate of claim 1.

11. The display device of claim 10, wherein the first wiring comprises a copper layer and a first metal layer that are stacked, the first metal layer is located on a surface of the copper layer proximate to the base substrate, and an adhesion force between the first metal layer and the stress buffer layer is greater than an adhesion force between the copper layer and the stress buffer layer.

12. The display device of claim 11, wherein the copper layer has a thickness in a range from 1 to 30 µm.

13. The display device of claim 11, wherein the first wiring further comprises a first conductive protection layer located on a surface of the copper layer proximate to the base substrate.

14. A method for preparing a driving substrate, comprising:
providing a base substrate;
forming a stress buffer layer on the base substrate;
forming a plurality of first wirings on the stress buffer layer through a single patterning process, the plurality of first wirings having a first thickness;
forming a first insulating layer covering the first wiring, the first insulating layer comprising a first via hole exposing a part of a surface of the first wiring;
forming a plurality of second wiring structures on the first insulating layer, each of the plurality of first wirings being connected to at least one of the plurality of second wiring structures through the first via hole penetrating through the first insulating layer, the plurality of second wiring structures having a second thickness of more than 6000 angstroms to 9000 angstroms, and the second thickness being less than the first thickness;
forming a second insulating layer covering the plurality of second wiring structures, the second insulating layer comprising at least two second via holes exposing a part of a surface of the second wiring structure, wherein the second insulating layer comprises an inorganic insulating layer and an organic insulating layer located on a surface of the inorganic insulating layer away from the base substrate; and
forming an electronic element on the second insulating layer, the electronic element being directly connected to the plurality of second wiring structures through the at least two second via holes penetrating through the second insulating layer, and an orthographic projection of the electronic element on the base substrate partially overlaps with orthographic projections of the plurality of second wiring structures on the base substrate,
wherein an aperture of an orthogonal projection of the first via hole on the base substrate is not greater than a line width of an orthogonal projection of the first wiring on the base substrate; an aperture of an orthogonal projection of the second via hole on the base substrate is not greater than a line width of an orthogonal projection of the second wiring on the base substrate.

15. The method of claim 14, wherein the forming the plurality of first wirings comprises:
depositing a first conductive layer having a first thickness on the stress buffer layer and patterning the first conductive layer, to form the plurality of first wirings.

16. The method of claim 14, wherein the forming the plurality of first wirings comprises:
depositing a seed layer having a thickness less than the first thickness on the stress buffer layer, forming a negative photoresist on the seed layer, and exposing and developing the photoresist to form a photoresist removal area and a photoresist reserved area, the photoresist removal area corresponding to the plurality of first wirings to be formed;
growing a third conductive layer by electroplating on the seed layer on which a pattern of the photoresist is formed;
removing the photoresist in the photoresist reserved area; and
etching the seed layer in the photoresist reserved area, the plurality of first wirings being composed of the third conductive layer and the seed layer in the photoresist removal area.

17. The method of claim 14, wherein the forming the plurality of first wirings comprises:
depositing a seed layer having a thickness less than the first thickness on the stress buffer layer, forming a photoresist on the seed layer, exposing and developing the photoresist to form a photoresist removal area and a photoresist reserved area, the photoresist reserved area corresponding to the first wiring to be formed, and etching the seed layer in the photoresist removal area, to form a pattern of the seed layer; and
growing a third conductive pattern on the pattern of the seed layer by electroplating, the plurality of first wirings being composed of the third conductive pattern and the pattern of the seed layer.

18. The method of claim 17, wherein before growing the third conductive pattern on the pattern of the seed layer by electroplating, the method further comprises:
forming a third inorganic insulating layer;
forming a third organic insulating layer on the third inorganic insulating layer;
exposing and developing the third organic insulating layer, to form a pattern of the third organic insulating layer, the pattern of the third organic insulating layer comprising a third organic insulating layer reserved area and a third organic insulating layer removal area, and the third organic insulating layer removal area coinciding with an area where the pattern of the seed layer is located; and
etching the third inorganic insulating layer by using the pattern of the third organic insulating layer as a mask, to form a pattern of the third inorganic insulating layer.

19. The method of claim 14, wherein the first insulating layer comprises a first inorganic insulating layer and a first organic insulating layer that are stacked, and the forming the first insulating layer comprises:
forming a first inorganic insulating layer;
forming a first organic insulating layer; and
exposing and developing the first organic insulating layer, to form a pattern of the first organic insulating layer comprising a third via hole, and etching the first inorganic insulating layer by using the pattern of the first organic insulating layer as a mask, to form a pattern of the first inorganic insulating layer comprising a fourth via hole, the third via hole communicating with the fourth via hole to form the first via hole.

20. The method of claim 14, wherein the second wiring structure comprises at least one second wiring layer, each of the at least one second wiring layer comprises a plurality of second wirings, and the forming the second wiring on the first insulating layer comprises:
sputtering a second conductive layer on the first insulating layer, and patterning the second conductive layer, to form the plurality of second wirings; or forming a second conductive layer on the first insulating layer by low-temperature deposition, and patterning the second conductive layer, to form the plurality of second wirings, a temperature of the low-temperature deposition being not greater than 50 degrees Celsius.

* * * * *